US010727010B1

(12) United States Patent
Henke et al.

(10) Patent No.: US 10,727,010 B1
(45) Date of Patent: Jul. 28, 2020

(54) POWER CONTACT END-OF-LIFE (EOL) PREDICTOR APPARATUS AND METHOD

(71) Applicant: Arc Suppression Technologies, Bloomington, MN (US)

(72) Inventors: Reinhold Henke, Alexandria, MN (US); Robert Thorbus, Chanhassen, MN (US)

(73) Assignee: Arc Suppression Technologies, Bloomington, MN (US)

( * ) Notice: Subject to any disclaimer, the term of this patent is extended or adjusted under 35 U.S.C. 154(b) by 0 days.

(21) Appl. No.: 16/776,123

(22) Filed: Jan. 29, 2020

Related U.S. Application Data

(60) Provisional application No. 62/898,795, filed on Sep. 11, 2019, provisional application No. 62/898,780, filed on Sep. 11, 2019, provisional application No. 62/898,798, filed on Sep. 11, 2019, provisional application No. 62/898,783, filed on Sep. 11, 2019, provisional application No. 62/898,787, filed on Sep. 11, 2019, provisional application No. 62/798,316, filed on Jan. 29, 2019, provisional application No.
(Continued)

(51) Int. Cl.
*H01H 9/54* (2006.01)
*H03K 3/313* (2006.01)
*H03K 17/60* (2006.01)
*H02M 3/156* (2006.01)
*H03K 3/45* (2006.01)
*H01H 71/04* (2006.01)

(52) U.S. Cl.
CPC ............ *H01H 9/547* (2013.01); *H02M 3/156* (2013.01); *H03K 3/313* (2013.01); *H03K 17/601* (2013.01); *H01H 2071/044* (2013.01); *H03K 3/45* (2013.01)

(58) Field of Classification Search
CPC ................................................. H01H 2071/044
See application file for complete search history.

(56) References Cited

U.S. PATENT DOCUMENTS

| 5,420,571 A | 5/1995 | Coleman et al. |
| 6,225,807 B1 * | 5/2001 | Pohl ..................... H01H 1/0015 324/423 |
| 7,705,601 B2 | 4/2010 | Zhou et al. |

(Continued)

FOREIGN PATENT DOCUMENTS

WO    WO-2004057634 A1 *   7/2004    ......... H01H 11/0062

*Primary Examiner* — Daniel J Cavallari
(74) *Attorney, Agent, or Firm* — Schwegman Lundberg & Woessner, P.A.

(57) ABSTRACT

A power contact EoL predictor includes a pair of terminals adapted to be connected to a set of switchable contact electrodes of a power contact; a power switching circuit configured to trigger activation of the contact electrodes based on a first logic state signal or deactivation based on a second logic state signal; a contact separation detector determining a time of separation of the switchable contact electrodes of the power contact during the deactivation, and a controller configured to generate the second logic state signal to trigger the deactivation, and determine a stick duration associated with the set of switchable contact electrodes. The stick duration is based on a difference between a time the second logic state signal is generated and the time of separation during the contact cycle. The controller generates an EoL prediction for the contact electrodes based on the determined stick duration for multiple contact cycles.

20 Claims, 8 Drawing Sheets

Related U.S. Application Data

62/798,326, filed on Jan. 29, 2019, provisional application No. 62/798,323, filed on Jan. 29, 2019.

(56) References Cited

U.S. PATENT DOCUMENTS

| | | |
|---|---|---|
| 2010/0153022 A1 | 6/2010 | Chen et al. |
| 2012/0123698 A1 | 5/2012 | Chen et al. |
| 2013/0187389 A1 | 7/2013 | Thangamani et al. |
| 2018/0172767 A1* | 6/2018 | Zhou ........................ H01H 9/54 |

\* cited by examiner

POWER CONTACT END-OF-LIFE (EOL) PREDICTOR APPARATUS AND METHOD

PRIORITY

This application claims the benefit of priority to U.S. Provisional Application Ser. No. 62/798,316, filed Jan. 29 2019; U.S. Provisional Application Ser. No. 62/798,323, filed Jan. 29, 2019; U.S. Provisional Application Ser. No. 62/798,326, filed Jan. 29, 2019; U.S. Provisional Application Ser. No. 62/898,780, filed Sep. 11, 2019, U.S. Provisional Application Ser. No. 62/898,783, filed Sep. 11, 2019, U.S. Provisional Application Ser. No. 62/898,787, filed Sep. 11, 2019, U.S. Provisional Application Ser. No. 62/898,795, filed Sep. 11, 2019, and U.S. Provisional Application Ser. No. 62/898,798, filed Sep. 11, 2019, with the contents of all of the above-listed applications being incorporated herein by reference in their entireties.

TECHNICAL FIELD

The present application relates generally to electrical contact End-of-Life (EoL) prediction apparatus and techniques, including electrical contacts connected in parallel or in series with each other.

BACKGROUND

Product designers, technicians, and engineers are trained to accept manufacturer specifications when selecting electromechanical relays and contactors. None of these specifications, however, indicate the serious impact of electrical contact arcing on the life expectancy of the relay or the contactor. This is especially true in high-power (e.g., over 2 Amp) applications.

Electrical current contact arcing may have a deleterious effect on electrical contact surfaces, such as relays and certain switches. Arcing may degrade and ultimately destroy the contact surface over time and may result in premature component failure, lower quality performance, and relatively frequent preventative maintenance needs. Additionally, arcing in relays, switches, and the like may result in the generation of electromagnetic interference (EMI) emissions. Electrical current contact arcing may occur both in alternating current (AC) power and in direct current (DC) power across the fields of consumer, commercial, industrial, automotive, and military applications. Because of its prevalence, there have literally been hundreds of specific means developed to address the issue of electrical current contact arcing.

SUMMARY

Various examples are now described to introduce a selection of concepts in a simplified form that is further described below in the detailed description. The Summary is not intended to identify key or essential features of the claimed subject matter, nor is it intended to be used to limit the scope of the claimed subject matter.

According to a first aspect of the present disclosure, there is provided an electrical circuit that includes a pair of terminals adapted to be connected to a set of switchable contact electrodes of a power contact. A power switching circuit is operatively coupled to the pair of terminals. The power switching circuit is configured to switch power from an external power source and to trigger activation of the set of switchable contact electrodes based on a first logic state signal or deactivation of the set of switchable contact electrodes based on a second logic state signal. A contact separation detector is operatively coupled to the pair of terminals. The contact separation detector is configured to determine a time of separation of the set of switchable contact electrodes of the power contact during the deactivation. A controller circuit is operatively coupled to the pair of terminals, the power switching circuit, and the contact separation detector. The controller circuit is configured to, for each contact cycle of a plurality of contact cycles of the power contact within at least one sampling window: generate the second logic state signal to trigger the deactivation of the set of switchable contact electrodes, and determine a stick duration associated with the set of switchable contact electrodes. The stick duration is based on a difference between a time the second logic state signal is generated and the time of separation during the contact cycle. An end-of-life (EoL) prediction is generated for the set of switchable contact electrodes of the power contact based on the determined stick duration for each contact cycle of the plurality of contact cycles within the at least one sampling window.

According to a second aspect of the present disclosure, there is provided a system including a first pair of terminals adapted to be connected to a first set of switchable contact electrodes of a first power contact. The system further includes a second pair of terminals adapted to be connected to a second set of switchable contact electrodes of a second power contact. The system further includes a power switching circuit operatively coupled to the first and second pairs of terminals. The power switching circuit is configured to switch power from an external power source and to trigger activation and deactivation of the first set and the second set of switchable contact electrodes based on a logic state signal. The system further includes an arc suppressor adapted to be coupled to the second set of switchable contact electrodes. The arc suppressor includes a contact separation detector configured to determine a time of separation of the second set of switchable contact electrodes during the deactivation. The system further includes a controller circuit operatively coupled to the first and second pairs of terminals, the power switching circuit, and the arc suppressor. The controller circuit is configured to determine a plurality of stick durations associated with the second set of switchable contact electrodes. Each stick duration of the plurality of stick durations is determined during a corresponding contact cycle of a plurality of contact cycles of the second power contact and is based on a time duration between the generation of the logic state signal triggering the deactivation and the time of separation of the second set of switchable contact electrodes. The controller further generates an end-of-life (EoL) prediction for the second set of switchable contact electrodes based on the determined plurality of stick durations.

According to a third aspect of the present disclosure, there is provided a method including coupling a power switching circuit to a pair of terminals of a power contact. The power switching circuit is configured to switch power from an external power source and to trigger activation and deactivation of a set of switchable contact electrodes of the power contact based on a logic state signal. The method further includes coupling a contact separation detector to the pair of terminals. The contact separation detector configured to determine a time of separation of the set of switchable contact electrodes during the deactivation. The method further includes coupling a controller circuit to the pair of terminals and the contact separation detector. The controller circuit is further configured to determine a plurality of stick durations associated with the set of switchable contact electrodes. Each stick duration of the plurality of stick durations is determined during a corresponding contact cycle of a plurality of contact cycles of the power contact and is based on a time duration between the generation of the logic state signal triggering the deactivation and the time of separation of the second set of switchable contact electrodes. The method further includes providing an EoL prediction for the set of switchable contact electrodes based on the determined plurality of stick durations.

Any one of the foregoing examples may be combined with any one or more of the other foregoing examples to create a new embodiment within the scope of the present disclosure.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

Figure 1:
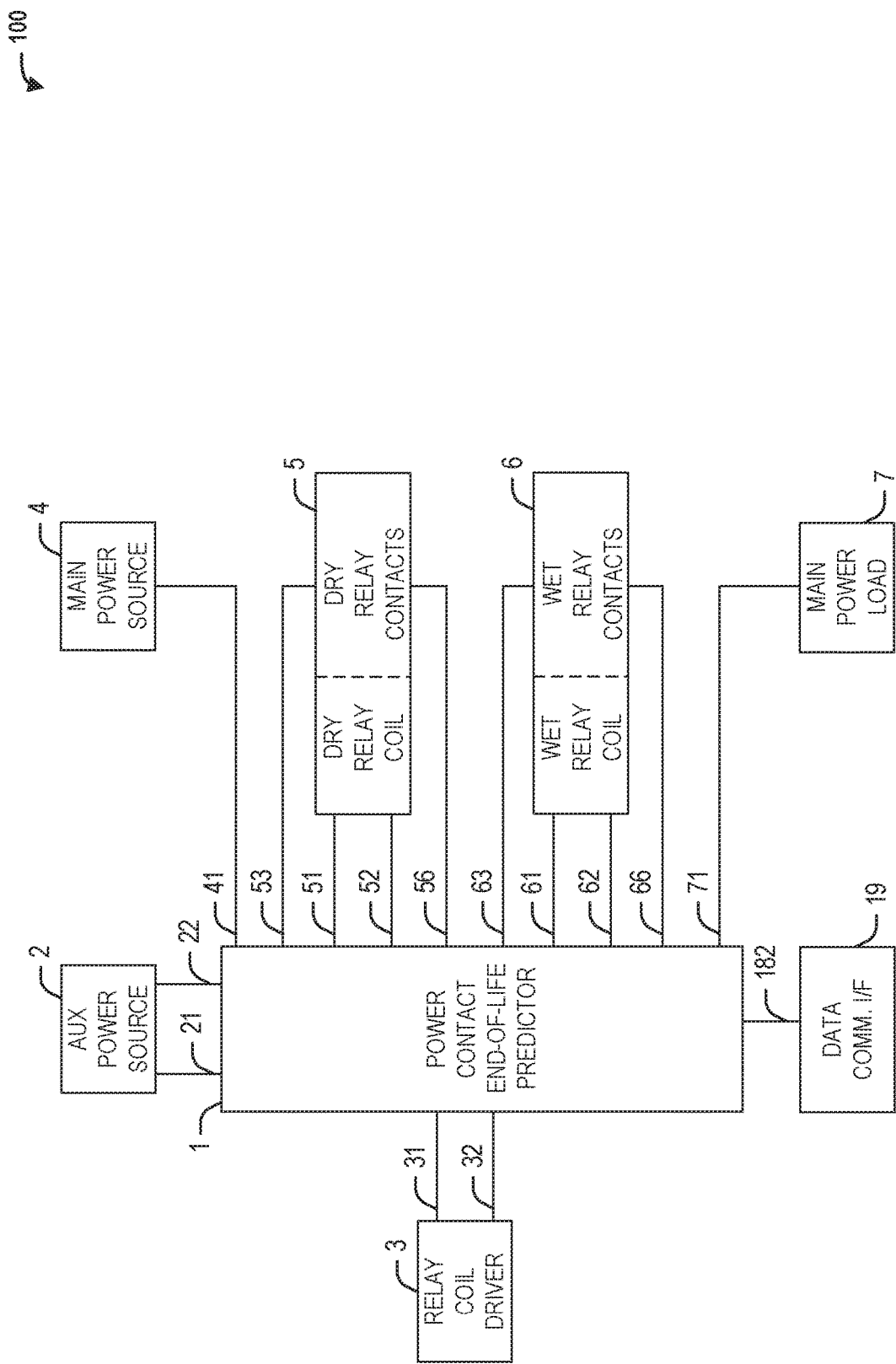
FIG. 1 is a diagram of a system including a power contact EoL predictor, according to some embodiments.

It should be understood at the outset that although an illustrative implementation of one or more embodiments is provided below, the disclosed systems, methods, and/or apparatuses described with respect to FIGS. 1-8 may be implemented using any number of techniques, whether currently known or not yet in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In the following description, reference is made to the accompanying drawings that form a part hereof, and in which are shown, by way of illustration, specific embodiments which may be practiced. These embodiments are described in sufficient detail to enable those skilled in the art to practice the inventive subject matter, and it is to be understood that other embodiments may be utilized, and that structural, logical, and electrical changes may be made without departing from the scope of the present disclosure. The following description of example embodiments is, therefore, not to be taken in a limiting sense, and the scope of the present disclosure is defined by the appended claims.

As used herein, the term "dry contact" (e.g., as used in connection with an interlock such as a relay or contactor) refers to a contact that is only carrying load current when closed. Such contact may not switch the load and may not make or break under load current. As used herein, the term "wet contact" (e.g., as used in connection with an interlock such as a relay or contactor) refers to a contact carrying load current when closed as well as switching load current during the make and break transitions.

Examples of power contact EoL predictor and components utilized therein and in conjunction with power contact EoL predictors are disclosed herein. Examples are presented without limitation and it is to be recognized and understood that the embodiments disclosed are illustrative and that the circuit and system designs described herein may be implemented with any suitable specific components to allow for the circuit and system designs to be utilized in a variety of desired circumstances. Thus, while specific components are disclosed, it is to be recognized and understood that alternative components may be utilized as appropriate.

Techniques disclosed herein relate to the design and configuration of a power contact EoL predictor to ensure reliable interlock performance by providing an indication that can be used to determine, e.g., how close to failure the power contact is and whether to replace the power contact. The power contact EoL predictor may provide stand-alone, in-situ, real-time, power contact stick duration measuring and recording, electrode surface degradation/decay detecting, and EoL prediction for the contact. In some aspects, for EoL prediction, only one current switching power contactor or relay may be used. The EoL prediction may be based on power contact stick duration past data collection as well as presently applied discrete power contact stick duration operations, enabling a prediction about a future power contact failure event. In some aspects, the EoL operations calculate the average stick duration within multiple sets of intervals, stacked or sliding sampling windows over a number of contact cycles. As used herein, the term "stick duration" refers to the time difference between coil activation/deactivation (e.g., a relay coil of a relay contact) and power contact activation/deactivation. In some aspects, the discussed EoL operations may be structured so that EoL prediction operations may be configured and executed in microcontrollers and microprocessors without the need for an external/computation apparatus or method. In various examples, the EoL prediction operations do not rely on extensive mathematical and/or calculus operations. In some aspects, the dry contactor may be optional for EoL prediction. The dry contactor may be utilized if high dielectric isolation and extremely low leakage currents are desired.

Arc suppressor is an optional element for the power contact end-of-life predictor. In some aspects, the disclosed power contact EoL predictor device may incorporate an arc suppression circuit (also referred to as an arc suppressor) coupled to the wet contact, to protect the wet contact from arcing during the make and break transitions and to reduce deleterious effects from contact arcing. The arc suppressor incorporated with the power contact EoL predictor discussed herein may include an arc suppressor as disclosed in the following issued U.S. Patents—U.S. Pat. Nos. 8,619,395 and 9,423,442, both of which are incorporated herein by reference in their entirety. A power contact arc suppressor extends the electrical life of a power contact under any rated load into the mechanical life expectancy range. With this, the published mechanical life expectancy becomes an intrinsic EoL expectancy limit for that specific power contact. Even though the figures depict a power contact EoL predictor 1 with an internal arc suppressor, the disclosure is not limited in this regard and the power contact EoL predictor 1 may also use an external arc suppressor or no arc suppressor.

When a power contact can no longer break the electrode micro weld in time, the contact is considered failed. Anecdotally, the power relay industry considers a contactor or relay contact failed if the contact stick duration exceeds one (1) second. The inevitable EoL event for any relay and contactor is a failure. Power contact EoL may be understood as the moment when a relay/contactor fails either electrically or mechanically. Power relays and contactors power contacts either fail closed, open or somewhere in between. Published power contact release times in relay and contactor datasheets are not the same as the power contact stick duration. The relay industry considers contacts with a current carrying capability of 2 A or greater, power contacts. Contacts with a current carrying capability of less than 2 A may not be considered power contacts. Conventional techniques to determine power contact condition may involve measuring power contact resistance. Such measurements, however, are performed ex-situ, using complex and expensive equipment to perform measurements.

Power contact electrode surface degradation/decay is associated with ever increasing power contact stick durations. Techniques disclosed herein may be used to perform an EoL prediction for a power contact using in-situ, real-time, stand-alone operation by, e.g., monitoring contact stick durations and detecting the gradual decay of the power contact electrode surface. In-situ may be understood to involve operating in an actual real-life, application while operating under normal or abnormal conditions. Real-time may be understood to involve performance data that is actual and available at the time of measurement. For example, real-time contact separation detection may be performed using real-time voltage measurements of the power contact voltage. Stand-alone-operation requires no additional connections, devices, or manipulations other than those outlined in the present disclosure this document (e.g., the main power connection, a relay coil driver connection, and an auxiliary power source connection).

FIG. 1 is a diagram of a system 100 including a power contact EoL predictor, according to some embodiments. Referring to FIG. 1, the system 100 may include a power contact EoL predictor 1 coupled to an auxiliary power source 2, a relay coil driver 3, a main power source 4, a dry relay 5, a wet relay 6, a main power load 7, and a data communication interface 19.

Figure 2:
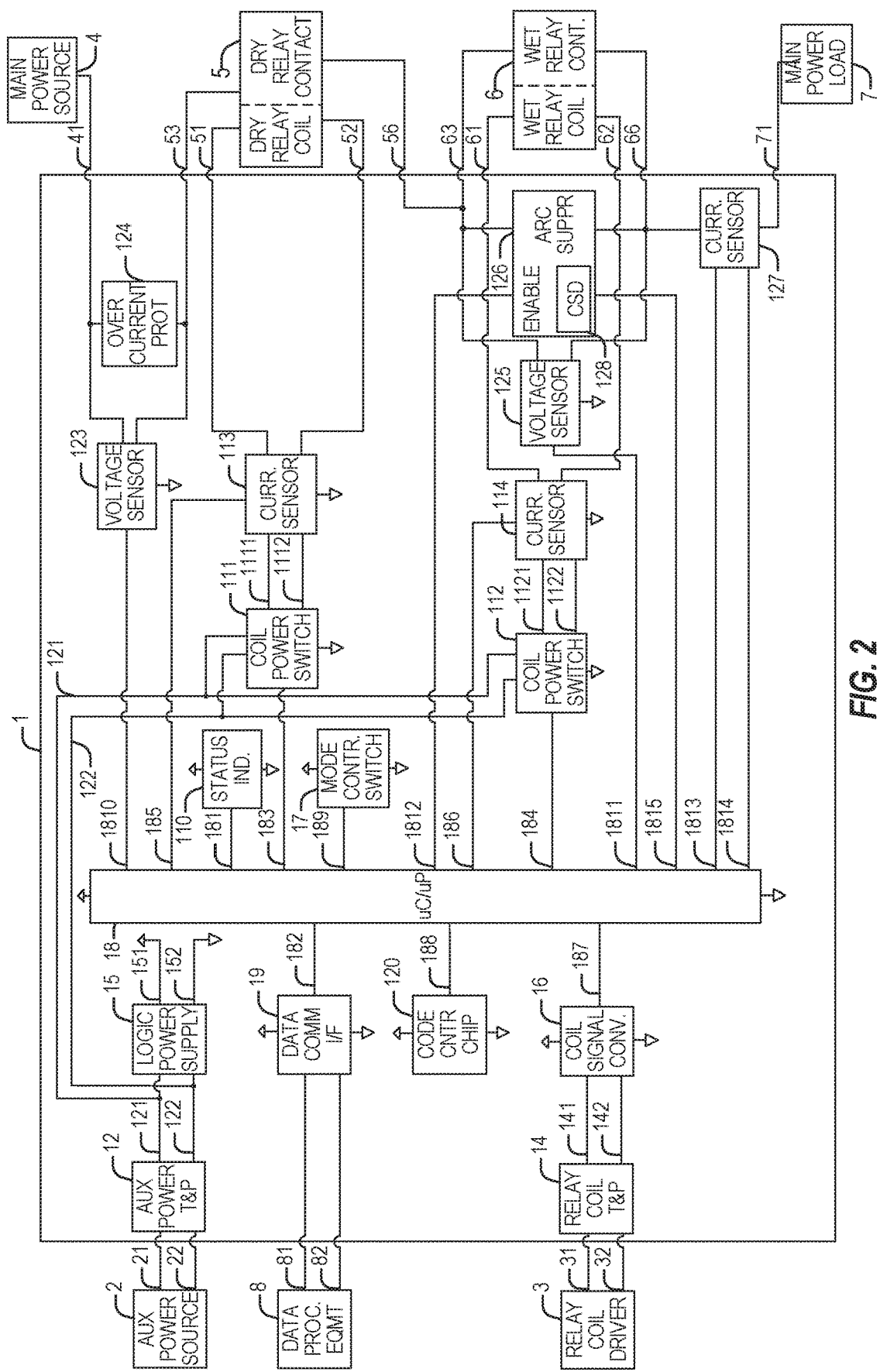
FIG. 2 is a block diagram of an example power contact EoL predictor, according to some embodiments.

The dry relay 5 may include a dry relay coil coupled to dry relay contacts, and the wet relay 6 may include a wet relay coil coupled to wet relay contacts. The dry relay 5 may be coupled to the main power source 4 via the power contact EoL predictor 1. The dry relay 5 may be coupled in series with the wet relay 6, and the wet relay 6 may be coupled to the main power load 7 via the power contact EoL predictor 1. Additionally, the wet relay 6 may be protected by an arc suppressor coupled across the wet relay contacts of the wet relay 6 (e.g., as illustrated in FIG. 2). Without an arc suppressor connected, the wet contactor or relay 6 contacts may become sacrificial and the dry contactor or relay 5 contacts may remain in excellent condition during normal operation of the power contact EoL predictor 1, ensuring that the device clears a fault condition in the case where the wet relay contacts have failed.

The main power source 4 may be an AC power source or a DC power source. Sources four AC power may include generators, alternators, transformers, and the like. Source four AC power may be sinusoidal, non-sinusoidal, or phase controlled. An AC power source may be utilized on a power grid (e.g., utility power, power stations, transmission lines, etc.) as well as off the grid, such as for rail power. Sources for DC power may include various types of power storage, such as batteries, solar cells, fuel cells, capacitor banks, and thermopiles, dynamos, and power supplies. DC power types may include direct, pulsating, variable, and alternating (which may include superimposed AC, full wave rectification, and half wave rectification). DC power may be associated with self-propelled applications, i.e., articles that drive, fly, swim, crawl, dive, internal, dig, cut, etc. Even though FIG. 1 illustrates the main power source 4 as externally provided, the disclosure is not limited in this regard and the main power source may be provided internally. e.g., a battery or another power source. Additionally, the main power source 4 may be a single-phase or a multi-phase power source.

Even though FIG. 1 illustrates the power contact EoL predictor 1 coupled to a dry relay 5 and a wet relay 6 that include a relay coil and relay contacts, the disclosure is not limited in this regard and other types of interlock arrangements may be used as well, such as switches, contactors, or other types of interlocks. In some aspects, a contactor may be a specific, heavy duty, high current, embodiment of a relay. Additionally, the power contact EoL predictor 1 may be used to generate an EoL prediction for a single power contact (one of the contacts of relays 5 and 6) or multiple power contacts (contacts for both relays 5 and 6).

The dry and wet contacts associated with the dry and wet relays in FIG. 1 may each include a pair of contacts, such as electrodes. In some aspects, the main power load 7 may be a general-purpose load, such as consumer lighting, computing devices, data transfer switches, etc. In some aspects, the main power load 7 may be a resistive load, such as a resistor, heater, electroplating device, etc. In some aspects, the main power load 7 may be a capacitive load, such as a capacitor, capacitor bank, power supply, etc. In some aspects, the main power load 7 may be an inductive load, such as an inductor, transformer, solenoid, etc. In some aspects, the main power load 7 may be a motor load, such as a motor, compressor, fan, etc. In some aspects, the main power load 7 may be a tungsten load, such as a tungsten lamp, infrared heater, industrial light, etc. In some aspects, the main power load 7 may be a ballast load, such as a fluorescent light, a neon light, a light emitting diode (LED), etc. In some aspects, the main power load 7 may be a pilot duty load, such as a traffic light, signal beacon, control circuit, etc.

The auxiliary power source 2 is an external power source that provides power to the wet and dry relay coils (of the wet relay 6 and the dry relay 5, respectively) according to the power contact EoL predictor 1. The first auxiliary power source node 21 may be configured as a first coil power termination input (e.g., to the auxiliary power termination and protection circuit 12 in FIG. 2). The second auxiliary power source node 22 may be configured as the second coil power termination input. The auxiliary power source 2 may be a single-phase or a multi-phase power source. Additionally, the coil power source 2 may be an AC power type or a DC power type.

The relay coil driver 3 is the external relay coil signal source which provides information about the energization status for the wet relay 6 coil and the dry relay 5 coil according to the control of the power contact EoL predictor 1. In this regard, the relay coil driver 3 is configured to provide a control signal. The first relay coil driver node 31 is a first coil driver termination input (e.g., to relay coil termination and protection circuit 14 in FIG. 2). The second relay coil driver node 32 may be configured as the second coil driver termination input. The relay coil driver 3 may be a single-phase or a multi-phase power source. Additionally, the relay coil driver 3 may be an AC power type or a DC power type.

The data communication interface 19 is an optional element that is coupled to the power contact EoL predictor 1 via one or more communication links 182. The data communication interface 19 may be coupled to external memory and may be used for, e.g., storing and retrieving data.

Data communication may not be required for the full functional operation of the power contact EoL predictor 1. In some aspects, the data communication interface 19 can include one or more of the following elements: a digital signal isolator, an internal transmit data (TxD) termination, an internal receive data (RxD) termination, an external receive data (Ext RxD) termination, and an external transmit data (Ext TxD) termination.

Data signal filtering, transient, over-voltage, over-current, and wire termination are not shown in the example data communication interface 19 in FIG. 1 and FIG. 2. In some aspects, the data communications interface 19 can be configured as an interface between the power contact EoL predictor 1 and one or more of the following: a Bluetooth controller, an Ethernet controller, a General Purpose Data Interface, a Human-Machine-Interface, an SPI bus interface, a UART interface, a USB controller, and a Wi-Fi controller.

The dry relay 5 may include two sections—a dry relay coil and dry relay contacts. As mentioned above, "dry" refers to the specific mode of operation of the contacts in this relay which makes or breaks the current connection between the contacts while not carrying current.

The first dry relay node 51 is the first dry relay 5 coil input from the power contact EoL predictor 1. The second dry relay node 52 is the second dry relay 5 coil input from the power contact EoL predictor 1. The third dry relay node 53 is the first dry relay contact connection with the main power source 4. The fourth dry relay node 56 is the second dry relay contact connection (e.g., with the wet relay 6). The dry relay 5 may be configured to operate with a single-phase or a multi-phase power source. Additionally, the dry relay 5 may be an AC power type or a DC power type.

The wet relay 6 may include two sections—a wet relay coil and wet relay contacts. As mentioned above, "wet" refers to the specific mode of operation of the contacts in this relay which makes or breaks the current connection between the contacts while carrying current.

The first wet relay node 61 is the first wet relay 6 coil input from the power contact EoL predictor 1. The second wet relay node 62 is the second wet relay 6 coil input from the power contact EoL predictor 1. The third wet relay node 63 is the first wet relay contact connection (e.g., with the dry relay). The fourth wet relay node 66 is the second wet relay contact connection (e.g., with the current sensor 127). The wet relay 6 may be configured to operate with a single-phase or a multi-phase power source. Additionally, the wet relay 6 may be an AC power type or a DC power type.

In some aspects, the power contact EoL predictor 1 is configured to support both the normally open (NO) contacts (also referred to as Form A contacts) and the normally closed (NC) contacts (also referred to as Form B contacts). In some aspects, the power contact EoL predictor 1 measures, records, and analyzes the time difference between coil activation (or deactivation) and power contact activation (or deactivation). In this regard, by monitoring and measuring contact stick durations (e.g., for multiple contact cycles), the gradual power contact electrode surface degradation/decay/decay may be detected and the estimated EoL may be predicted in absolute or relative terms for the power contact. For example, the power contact EoL prediction may be expressed in percent of cycles left to EoL, numbers of cycles, etc.

Using the techniques discussed herein in connect with a power contact EoL predictor results in the following beneficial outcomes: reducing or eliminating preventive maintenance program requirements; reducing or eliminating scheduled service calls; reducing or eliminating prophylactic contact, relay or contactor replacements; power contact life degradation/decay detection; power contact EoL prediction; power contact life-left estimator; EoL alerts based on pre-set values. Data communication interfacing may be optional for the discussed EoL predictor.

In comparison, conventional techniques are based on ex-situ analysis of power contact resistance increase as an indication of power contact decay and a metric for impending power contact failure prediction. Such conventional techniques are not based on in-site EoL prediction, not based on mathematical analysis, and not taking into account the instant of power contact separation.

FIG. 2 is a block diagram of an example power contact EoL predictor 1 with an arc suppressor, according to some embodiments. Referring to FIG. 2, the power contact EoL predictor 1 comprises an auxiliary power termination and protection circuit 12, a relay coil termination and protection circuit 14, a logic power supply 15, a coil signal converter 16, mode control switches 17, a controller (also referred to as microcontroller or microprocessor) 18, data communication interface 19, a status indicator 110, a code control chip 120, a voltage sensor 123, an overcurrent protection circuit 124, a voltage sensor 125, an arc suppressor 126 with a contact separation detector (CSD) 128), a current sensor 127, a dry coil power switch 111, a dry coil current sensor 113, a wet coil power switch 112, and a wet coil current sensor 114.

The data processing equipment 8 receives, processes, and transmits data to and from the power contact EoL predictor 1 (via the data communication interface 19) in support of calculations that cannot be performed by the power contact EoL predictor 1 itself and for further use by any other external data management mechanism and network. The data processing equipment 8 connection node 81 is the first data communication interface 19 input. The data processing equipment 8 connection node 82 is the second data communication interface 19 input. The data processing equipment 8 may not be required for the full functional operation of the power contact EoL predictor 1.

The auxiliary power termination and protection circuit 12 is configured to provide external wire termination and protection to all elements of the power contact EoL predictor 1. The first auxiliary power termination and protection circuit 12 node 121 is the first logic power supply 15 input, the first coil power switch 111 input, and the first coil power switch 112 input. The second auxiliary power termination and protection circuit 12 node 122 is the second logic power supply 15 input, the second coil power switch 111 input, and the second coil power switch 112 input.

In some aspects, the auxiliary power termination and protection circuit 12 is includes one or more of the following elements: a first relay coil driver terminal a second relay coil driver terminal, an overvoltage protection, an overcurrent protection, a reverse polarity protection, optional transient and noise filtering, optional current sensor, and optional voltage sensor.

The relay coil termination and protection circuit 14 provides external wire termination and protection to all elements of the power contact EoL predictor 1. The first coil termination and protection circuit 14 node 141 is the first coil signal converter circuit 16 input. The second coil termination and protection circuit 14 node 142 is the second coil signal converter 16 input.

In some aspects, the relay coil termination and protection circuit 14 includes one or more of the following elements: a first relay coil driver terminal, a second relay coil driver terminal, an overvoltage protection, an overcurrent protection, a reverse polarity protection, optional transient and noise filtering, a current sensor (optional), and a voltage sensor (optional).

The logic power supply 15 is configured to provide logic level voltage to all digital logic elements of the power contact EoL predictor 1. The first logic power supply output 151 is the positive power supply terminal indicated by the positive power schematic symbol in FIG. 2. The second logic power supply output 152 is the negative power supply terminal indicated by the ground reference symbol in FIG. 2.

In some aspects, the logic power supply 15 includes one or more of the following elements: an AC-to-DC converter, input noise filtering, and transient input protection, input bulk energy storage, output bulk energy storage, output noise filtering, a DC-to-DC converter (alternative), an external power converter (alternative), a dielectric isolation (internal or external), an overvoltage protection (internal or external), an overcurrent protection (internal or external), product safety certifications (internal or external), and electromagnetic compatibility certifications (internal or external).

The coil signal converter circuit 16 converts a signal indicative of the energization status of the wet and dry coils from the relay coil driver 3 into a logic level type signal communicated to the controller 18 via node 187 for further processing.

In some aspects, the coil signal converter 16 is comprised of one or more of the following elements: current limiting elements, dielectric isolation, signal indication, signal rectification, optional signal filtering, optional signal shaping, and optional transient and noise filtering.

The mode control switches 17 allow manual selection of specific modes of operation for the power contact EoL predictor 1. In some aspects, the mode control switches 17 include one or more of the following elements: push buttons for hard resets, clearings or acknowledgements, DIP switches for setting specific modes of operation, and (alternatively in place of push buttons) keypad or keyboard switches.

The controller 18 comprises suitable circuitry, logic, interfaces, and/or code and is configured to control the operation of the power contact EoL predictor 1 through, e.g., software/firmware-based operations, routines, and programs. The first controller node 181 is the status indicator 110 connection. The second controller node 182 is the data communication interface 19 connection. The third controller node 183 is the dry coil power switch 111 connection. The fourth controller node 184 is the wet coil power switch 112 connection. The fifth controller node 185 is the dry coil current sensor 113 connection. The sixth controller node 186 is the wet coil current sensor 114 connection. The seventh controller node 187 is the coil signal converter circuit 16 connection. The eight controller node 188 is the code control chip 120 connection. The ninth controller node 189 is the mode control switches 17 connection. The tenth controller node 1810 is the overcurrent voltage sensor 123 connection.

The eleventh controller node 1811 is the voltage sensor 125 connection. The twelfth controller node 1812 is the arc suppressor 126 enable connection. The thirteenth controller node 1813 is the first current sensor 127 connection. The fourteenth controller node 1814 is the second current sensor 127 connection. The fifteenth controller node 1815 is the contact separation detector 128 output connection.

In some aspects, controller 18 may be configured to control one or more of the following operations associated with the power contact EoL predictor 1: algorithm management; authenticity code control management; auto-detect operations; auto-detect functions; automatic normally closed or normally open contact form detection: auto mode settings: coil cycle (Off, Make. On, Break, Off) timing, history, and statistics; coil delay management; history management; power contact sequencing: coil driver signal chatter history and statistics; data management (e.g., monitoring, detecting, recording, logging, indicating, and processing); data value registers for present, last, past, maximum, minimum, mean, average, standard deviation values, etc.; date and time formatting, logging, and recording; embedded microcontroller with clock generation, power on reset, and watchdog timer; error, fault, and failure management; factory default value recovery management: firmware upgrade management; flash code generation; fault indication clearing; fault register reset: hard reset; interrupt management: license code control management; power-on management; power-up sequencing; power hold-over management; power turn-on management; reading from inputs, memory, or registers; register address organization; register data factory default values; register data value addresses; register map organization; soft reset management; SPI bus link management; statistics management; system access management; system diagnostics management; UART communications link management; wet/dry relay coil management; and writing to memory, outputs, and registers.

The status indicator 110 provides audible, visual, or other user alerting methods through operational health, fault, code indication via specific colors or flash patterns. In some aspects, the status indicator 110 may provide one or more of the following types of indications: bar graphs, graphic display, LEDs, a coil driver fault indication, a coil state indication, a dry coil fault indication, a mode of operation indication, a processor health indication, and wet coil fault indication.

The dry coil power switch 111 connects the externally provided coil power to the dry relay coil 5 via nodes 51 and 52 based on the signal output from controller 18 via command output node 183. In some aspects, the dry coil power switch 111 includes one or more of the following elements: solid-state relays, current limiting elements, and optional electromechanical relays.

The wet coil power switch 112 connects the externally provided coil power to the wet relay coil 6 via nodes 61 and 62 based on the signal output from controller 18 via command output node 184. In some aspects, the wet coil power switch 112 includes one or more of the following elements: solid-state relays, current limiting elements, and optional electromechanical relays.

The dry coil current sensor 113 is configured to sense the value and/or the absence or presence of the dry relay coil 5 current. In some aspects, the dry coil current sensor 113 includes one or more of the following elements: solid-state relays, a reverse polarity protection element, optoisolators, optocouplers, Reed relays and/or Hall effect sensors (optional), SSR AC or DC input (alternative), and SSR AC or DC output (alternative).

The wet coil current sensor 114 is configured to sense the value and/or the absence or presence of the dry relay coil 6 current. In some aspects, the wet coil current sensor 114 includes one or more of the following elements: solid-state relays, a reverse polarity protection element, optoisolators, optocouplers, Reed relays and/or Hall effect sensors (optional). SSR AC or DC input (alternative), and SSR AC or DC output (alternative).

The code control chip 120 is an optional element of the power contact EoL predictor 1, and it is not required for the fully functional operation of the device. In some aspects, the code control chip 120 may be configured to include application or customer specific code with encrypted or non-encrypted data security. In some aspects, the code control chip 120 function may be implemented externally via the data communication interface 19. In some aspects, the code control chip 120 may be configured to store the following information: access control code and data, alert control code and data, authentication control code and data, encryption control code and data, chip control code and data, license control code and data, validation control code and data, and/or checksum control code and data. In some aspects, the code control chip 120 may be implemented as an internal component of controller 18 or may be a separate circuit that is external to controller 18 (e.g., as illustrated in FIG. 2).

The voltage sensor 123 is configured to monitor the condition of the overcurrent protection 124. In some aspects, the voltage sensor 123 includes one or more of the following elements: solid-state relays, a bridge rectifier, current limiters, resistors, capacitors, reverse polarity protection elements, optoisolators, optocouplers, Reed relays and analog to digital converters (optional).

The overcurrent protection circuit 124 is configured to protect the power contact EoL predictor 1 from destruction in case of an overcurrent condition. In some aspects, the overcurrent protection circuit 124 includes one of more of the following elements: fusible elements, fusible printed circuit board traces, fuses, and circuit breakers.

The voltage sensor 125 is configured to monitor the voltage across the wet relay 6 contacts. In some aspects, the voltage sensor 125 includes one or more of the following elements: solid-state relays, a bridge rectifier, current limiters, resistors, capacitors, reverse polarity protection elements, and alternative or optional elements such as optoisolators, optocouplers, solid-state relays, Reed relays, and analog-to-digital converters. In some aspects, the voltage sensor 125 may be used for detecting contact separation of the contact electrodes of the wet relay 6. More specifically, the connection 1811 may be used by the controller 18 to detect that a voltage between the contact electrodes of the wet relay 6 measured by the voltage sensor 125 is at a plasma ignition voltage level (or arc initiation voltage level) or above. The controller 18 may determine there is contact separation of the contact electrodes of the wet relay 6 when such voltage levels are reached or exceeded. The determined time of contact separation may be used to determine contact stick duration, which may be used for the EoL prediction.

The arc suppressor 126 is configured to provide arc suppression for the wet relay 6 contacts. The arc suppressor 126 may be either external to the power contact EoL predictor 1 or, alternatively, may be implemented as an integrated part of the power contact EoL predictor 1. The arc suppressor 126 may be configured to operate with a single-phase or a multi-phase power source. Additionally, the arc suppressor 8 may be an AC power type or a DC power type.

In some aspects, the arc suppressor 126 may be deployed for normal load conditions. In some aspects, the arc suppressor 126 may or may not be designed to suppress a contact fault arc in an overcurrent or contact overload condition.

In some aspects, the connection 1812 between the arc suppressor 126 lock and the controller 18 may be used for enabling (unlocking) the arc suppressor (e.g., when the relay coil driver signal is active) or disabling (locking) the arc suppressor (e.g., when the relay coil driver signal is inactive).

In some aspects, the arc suppressor 126 may include a contact separation detector (CSD) 128 configured to detect a time instance when the wet relay 6 power contact electrodes separate as part of a contact cycle. The connection 1815 with the controller 18 may be used to communicate a contact separation indication of a time instance when the CSD 128 has detected contact separation within a contact cycle of the wet relay 6. The contact separation indication may be used by the controller 18 to provide an EoL prediction with regard to the condition of the contact electrodes of the wet relay 6.

In some aspects, the arc suppressor 126 may be a single-phase or a multi-phase arc suppressor. Additionally, the arc suppressor may be an AC power type or a DC power type.

The current sensor 127 is configured to monitors the current through the wet relay 6 contacts. In some aspects, the current sensor 126 includes one of more of the following elements: solid-state relays, a bridge rectifier, current limiters, resistors, capacitors, reverse polarity protection elements, and alternative or optional elements such as optoisolators, optocouplers, Reed relays, and analog-to-digital converters.

In some aspects, the controller 18 status indicator output pin (SIO) pin 181 transmits the logic state to the status indicators 110. SIO is the logic label state when the status indicator output is high, and /SIO is the logic label state when the status indicator output is low.

In some aspects, the controller 18 data communication interface connection (TXD/RXD) 182 transmits the data logic state to the data communications interface 19. RXD is the logic label state identifying the receive data communications mark, and /RXD is the logic label state identifying the receive data communications space. TXD is the logic label state identifying the transmit data communications mark, and /TXD is the logic label state identifying the transmit data communications space.

In some aspects, the controller 18 dry coil output (DCO) pin 183 transmits the logic state to the dry coil power switch 111. DCO is the logic label state when the dry coil output is energized, and /DCO is the logic label state when the dry coil output is de-energized.

In some aspects, the controller 18 wet coil output pin (WCO) 184 transmits the logic state to the wet coil power switch 112. WCO is the logic state when the wet coil output is energized, and /WCO is the logic state when the wet coil output is de-energized.

In some aspects, the controller 18 dry coil input pin (DCI) 185 receives the logic state of the dry coil current sensor 113. DCI is the logic state when the dry coil current is absent, and /DCI is the logic state when the dry coil current is present.

In some aspects, the controller 18 wet coil input pin (WCI) 186 receives the logic state of the wet coil current sensor 114. WCI is the logic label state when the wet coil current is absent, and /WCI is the logic label state when the wet coil current is present.

In some aspects, the controller 18 coil driver input pin (CDI) 187 receives the logic state of the coil signal converter

16. CDI is the logic state of the de-energized coil driver. /CDI is the logic state of the energized coil driver.

In some aspects, the controller 18 code control connection (CCC) 188 receives and transmits the logic state of the code control chip 120. CCR is the logic label state identifying the receive data logic high, and /CCR is the logic label state identifying the receive data logic low. CCT is the logic label state identifying the transmit data logic high, and /CCT is the logic label state identifying the transmit data logic low.

In some aspects, the controller 18 mode control switch input pin (S) 189 receives the logic state from the mode control switches 17. S represents the mode control switch open logic state, and /S represents the mode control switch closed logic state.

In some aspects, the controller 18 connection 1810 receives the logic state from the overcurrent protection (OCP) voltage sensor 123. OCPVS is the logic label state when the OCP is not fused open, and /OCPVS is the logic label state when the OCP is fused open.

In some aspects, the controller 18 connection 1811 receives the logic state from the wet contact voltage sensor (VS) 125. WCVS is the logic label state when the VS is transmitting logic high, and /WCVS is the logic label state when the VS is transmitting logic low.

In some aspects, the controller 18 connection 1812 transmits the logic state to the arc suppressor 126 lock. ASE is the logic label state when the arc suppression is enabled, and /ASE is the logic label state when the arc suppression is disabled.

In some aspects, the controller 18 connections 1813 and 1814 receive the logic state from the contact current sensor 127. CCS is the logic label state when the contact current is absent, and /CCS is the logic label state when the contact current is present.

In some aspects, the controller 18 may configure one or more timers (e.g., in connection with detecting a fault condition and sequencing the deactivation of the wet and dry contacts). Example timer labels and definitions of different timers that may be configured by controller 18 include one or more of the following timers.

In some aspects, the coil driver input delay timer delays the processing for the logic state of the coil driver input signal. COIL_DRIVER_INPUT_DELAY_TIMER is the label when the timer is running.

In some aspects, the switch debounce timer delays the processing for the logic state of the switch input signal. SWITCH_DEBOUNCE_TIMER is the label when the timer is running.

In some aspects, the receive data timer delays the processing for the logic state of the receive data input signal. RECEIVE_DATA_DELAY_TIMER is the label when the timer is running.

In some aspects, the transmit data timer delays the processing for the logic state of the transmit data output signal. TRANSMIT_DATA_DELAY_TIMER is the label when the timer is running.

In some aspects, the wet coil output timer delays the processing for the logic state of the wet coil output signal. WET_COIL_OUTPUT_DELAY_TIMER is the label when the timer is running.

In some aspects, the wet current input timer delays the processing for the logic state of the wet current input signal. WET_CURRENT_INPUT_DELAY_TIMER is the label when the timer is running.

In some aspects, the dry coil output timer delays the processing for the logic state of the dry coil output signal. DRY_COIL_OUTPUT_DELAY_TIMER is the label when the timer is running.

In some aspects, the dry current input timer delays the processing for the logic state of the dry current input signal. DRY_CURRENT_INPUT_DELAY_TIMER is the label when the timer is running.

In some aspects, the signal indicator output delay timer delays the processing for the logic state of the signal indicator output. SIGNAL_INDICATOR_OUTPUT_DELAY_TIMER is the label when the timer is running.

Referring to FIG. 2, the contact separation detector (CSD) 128, which may be part of the arc suppressor 126, is used for indicating the actual breaking of the contact micro weld followed by the gradual opening gap between the contact electrodes and subsequent separating electrodes. Without a CSD, the determination when to stop measuring the stick duration timer/sampler is uncertain. More specifically, the load current may not be considered an indicator for contact motion because a contact arc may form between the electrodes and the contact arc may be carrying the load current until the arc terminates. This timing randomness and fluctuation associated with using the load current as an indicator for contact separation introduces uncertainty into the prediction operations, practically rendering this method useless.

End-of-Life Prediction

The power CSD 128 indicates the instant the power contact break arc initiates and with that allows for a predictable timing reference in order to determine the time difference between coil deactivation (Form A) and the opening of the power contact as a way to determine the contact stick duration. This time difference is greatly influenced by the power contact stick duration due to normal power contact micro welding. Even if the break of the micro weld takes more than one second, the power contact (e.g., the contact electrodes of the wet relay 6) may still prove to be functional albeit pass normal expectations. Once the micro weld cannot be broken anymore by the force of the contactor mechanism which is designed to open the power contact or break the micro weld, the power contact is considered failed.

In some aspects, the CSD 128 is configured to detect the moment of contact separation, which may be the moment a break arc initiates between the two power contact electrodes. In some aspects, the voltage sensor 125 may be used to determine the moment of contact separation for purposes of EoL prediction using contact stick duration. More specifically, the controller 18 may determine that the contact electrodes of the wet relay 6 have separated when the contact voltage reported by the voltage sensor 125 is at (or above) a plasma ignition voltage level (or arc initiation voltage level). The controller 18 may perform the EoL prediction based on stick duration measurements during multiple sampling windows, where each stick duration associated with a contact cycle performed during a sampling window is determined as the time between deactivation of the coil of the wet relay 6 (i.e., the time the contacts are de-energized) and the time of contact separation.

Contact Stick Duration

The power contact stick duration, its growth, and its change of growth as a function of the number of contact cycles within a series of consecutive sliding sampling windows and their mathematical analysis are surrogates for the electrode surface degradation/decay and are the basis for power contact end-of-life predictions of the power contact end-of-life predictor 1. As mentioned above, the power contact stick duration is the time difference between the coil activation signal to break the power contact and the actual power contact separation.

In some aspects, the power CSD 128 inside the arc suppressor 126 reports the precise moment of contact separation. This is the very moment the contact breaks the micro weld and the two contact electrodes start to move away from each other. Without an arc suppressor, even though the contact is separated, and the electrodes are moving away from each other, due to the maintained arc between the two electrodes, current is still flowing across the contact and through the power load. The power CSD 128 provides a higher degree of prediction accuracy compared to using the moment where the current stops flowing between the separating power contact electrodes when the maintained arc terminates.

In some aspects, analysis of power contact stick duration over time, as the contact keeps on power cycling through its operational life, allows for the prediction of power contact EoL by the EoL predictor 1. For example, increasing power contact stick durations, as the number of contact cycles increases, is an indication of deteriorating power contact health (e.g., surface electrode degradation/decay).

A certain power contact stick duration is considered by the relay industry as a failure and a permanently welded contact is a failed power contact. When a power contact gets older, the power contact stick duration becomes longer. When the spring force becomes weaker over time then the power contact stick durations become longer. When the current is higher and the micro weld gets stronger, the power contact stick durations become longer. In some aspects, mathematical analysis of power contact stick duration as a function of power contact cycles allows the prediction of power contact EoL. The mathematical analysis compares the power contact stick duration increase between two fixed, non-overlapping sampling windows. Power contact stick duration increase is also an indication of power contact decay and a surrogate for impending power contact failure prediction.

In some aspects, EoL prediction when operating in conjunction with an arc suppressor is in line with the appearance of the power contact electrode surface condition (morphology). The EoL predictions may be provided in terms of numbers of cycles, which may be in the order of hundreds of millions and more. Those results cannot outperform the device specific mechanical contact life expectancy under no current load.

Contact Stick Duration Sampling

In some aspects, the following registers (e.g., as provided herein below) may be used to store stick duration data during sampling windows: Average SD Register, Present SD Register, Max peak Register, etc.

In some aspects, the EoL predictor 1 can be configured to perform operations to generate a prediction in terms of cycles left to reach the set average stick duration limit and/or peak stick duration limit, and/or a mechanical lifetime limit of the relay.

In some aspects, the average contact stick duration, speed, and acceleration are required to calculate the point of predicted end-of-life for the power contact. For example, a sampling window may be configured with a certain number of contact cycles (e.g., 1024). Contact stick durations may be determined for each contact cycle and can be stored for additional processing (e.g., to calculate one or more of the EoL parameters listed herein below). An EoL prediction may be generated based on one or more of the determined EoL parameters. In some aspects, the EoL parameters may include: power contact average stick duration (indicator of time); power contact average stick duration increase (indication of speed of increase of the stick duration); power contact average stick duration speed of increase (indication of acceleration of the stick duration increase speed); power contact peak stick duration (the peak within a sampling window: an indicator of time); power contact peak stick duration increase (indication of speed of increase of the peak stick duration); power contact peak stick duration speed of increase (indication of acceleration of the stick peak duration increase speed); power contact stick duration crest factor (defined herein below); power contact stick duration crest factor increase; and power contact stick duration crest factor speed of increase (acceleration).

The power contact stick duration crest factor (PCSDCF) is defined as follows. PCSDCF is the power contact stick duration crest factor. PCPSD is the power contact peak stick duration. PCASD is the power contact average stick duration. The PCSDCF may be defined as PCSDCF=PCPSD/PCASD.

In some aspects, stick duration may be measured one sample per cycle, the measured data may include contact stick duration per contact cycle, with a data range of 0 ms to 1000 ms. As a new stick duration average has been calculated, a stick duration crest factor may be calculated. Instant stick duration may be understood to involve the single present value. Stick duration crest factor may be understood to involve the maximum peak stick duration value (SDpkmax) divided by the average stick duration value of N samples (SDavg).

In this regard, a stick duration crest factor (SDCF) is defined as SDCF=SDpkmax/SDavg.

Stick Duration Sample Windowing

As mentioned herein above, one or more registers may be used as sampling window registers where stick duration data may be stored and manipulated for purposes of generating an EoL prediction.

Figure 7:
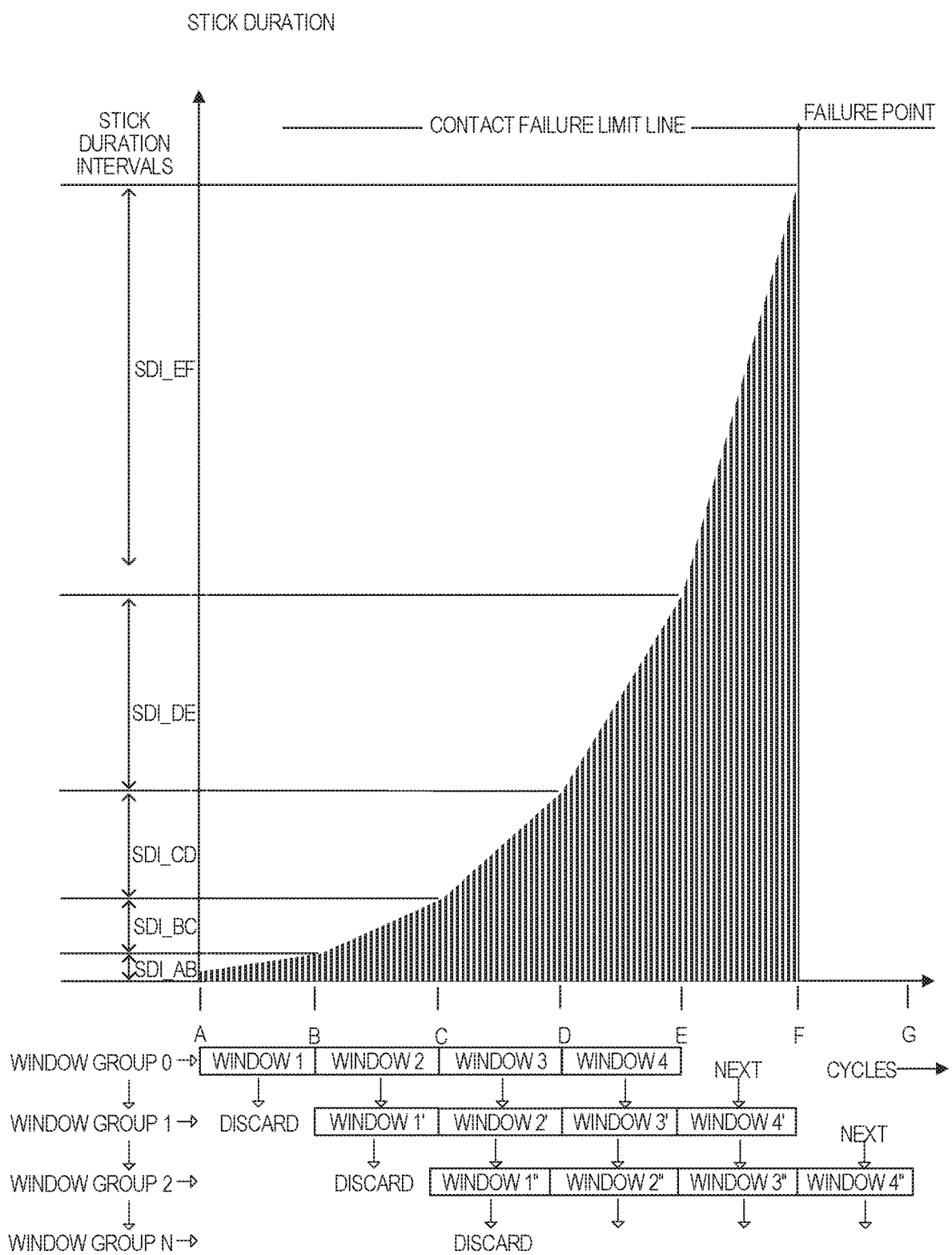
FIG. 7 depicts a graph of contact stick duration measurements during multiple sampling windows (or stick duration intervals) for performing EoL prediction by the EoL predictor of FIG. 2, according to some embodiments.

In some aspects, multiple sampling windows (Wi) may be used (e.g., as illustrated in FIG. 7), where each sampling window is associated with a preconfigured number of contact cycles. In some aspects, sampling windows W1 and W2 may be used as a minimum for linear EoL predictions. In some aspects, at least measurements in W1, W2, and W3 sampling windows may be used for higher order predictions (e.g., for speed and acceleration based predictions).

In some aspects, the following averaging function may be used for averaging stick duration measurements within a sampling window: AVG=(Sigma X(n))/n, where n may be a power of 2 integer. In some aspects, the controller 18 may perform this averaging function by simply shifting the binary sigma X(n) value in the register by n bits to the right to perform a division without the need for an arithmetic logic unit to perform the division.

In some aspects, the difference between two consecutive sets of window stick duration averages relates to the speed of the power contact electrode surface degradation/decay. In some aspects, the following different window parameters can be used either individually or together to provide a prediction range:

EoL prediction based on average stick duration between a set of consecutive windows or intervals;

EoL prediction based on peak stick duration between a set of consecutive windows or intervals;

EoL prediction based on stick duration crest factor between a set of consecutive windows or intervals; and EoL prediction based on the product of average stick duration and peak stick duration between a set of consecutive windows or intervals.

In some aspects, the following algorithm variables may be used during the EoL prediction: number of cycles within the window size (x ms to N ms). One set of sampling window data may be used to calculate the average contact stick duration. Two sets of sampling window data may be used to calculate the average contact stick speed. Three sets of sampling window data may be used to calculate the average contact stick acceleration. The maximum peak stick duration may also be recorded per sampling window and used for EoL prediction.

Sampling Window Structure

A 4-byte register ($2^{(4\times8)}$) may be used for storing stick duration data from up to 4.3 billion contact cycles. A 3-byte register ($2^{(3\times8)}$) may be used for storing stick duration data from up to 16.8 mega cycles.

In some aspects, the size of each sampling window W may automatically adjust based on EoL prediction parameters to be usable for EoL predictions. Initial stick duration (SD) average calculations may result in negative speed due to initial SD fluctuations and negative acceleration due to initial SD fluctuations. In such cases, the sampling window size may be adjusted until the SD speed (growth) is greater than zero (e.g., the sampling window size may be adjusted by increasing the contact cycle quantity per window).

In some aspects, multi-layered, multi-stacked, and/or multi-staged window structure may be used. In some aspects, two windowing options may be used—consecutive and continuous sampling windows. They may be used either individually or combined for prediction purposes.

Consecutive (stepped) sampling windows may be understood to include a first group of N samples window. The second group of N samples window starts after the last sample for the first window was taken.

Continuous (sliding) sampling windows are characterized to include that after the first group of N samples window is complete, the N samples may be maintained via discarding the first sample of N samples and replacing the last samples of N with the newly acquired sample. Maintaining a constant sliding window of N stick duration samples.

In some aspects, a continuous average may be calculated after the inclusion of a new sample into the window. In some aspects, average stick duration may be understood to involve the present average value for the window containing N samples. In some aspects, maximum peak stick duration may be understood to involve the present average value for the window containing N samples.

In some aspects, a Subset/Group=Window=N Samples, and Superset/Group=N Windows. Once initial sampling window parameters have been established then the number of collected stick duration sample quantity per window may be selected. A second sampling window stick duration data may be acquired to calculate the average stick duration (SD) speed, where growth/increase in SD is indicated by a positive difference between the measurement from two sampling windows (e.g., W2−W1). A third sampling window stick duration data may be acquired to calculate average SD acceleration, where growth/increase in SD speed is indicated by a positive difference between W3−W2/W2−W1. In some aspects, the difference between two neighboring sets of sliding window stick speed averages relates to the acceleration of the power contact electrode surface degradation.

EoL Predicting

In some aspects, prediction limits may be set in the limit register. In some aspects, the individual relay (contactor) mechanical life represents the end-of-life prediction limit. In some aspects, the EoL prediction may be performed based on one or more of the following: average stick duration parameters (duration, speed of increase, acceleration of increase); the speed of increase may be interpreted as No speed EoL=Infinite; the speed of increase without acceleration may be interpreted as a linear SD growth function; the speed of increase with acceleration may be interpreted as higher SD order growth function; sample noise discrimination (truncate decimals, e.g., changes in nanoseconds); speed fluctuations (no prediction when negative): acceleration fluctuations (no prediction when negative).

In some aspects, the following may be displayed by the EoL predictor 1: mechanical limit (ML) of the contact; actual maximum stick duration; actual average stick duration; and current EoL (e.g., in a number of contact cycles left) if less than the ML. If ML is not indicated, then all EoL prediction values may be displayed.

EoL Prediction Algorithm

In some aspects, the EoL predictor 1 may use the following stand-alone, in-situ EoL algorithm. Operations may be rolled down operations from present to EoL limit value register. The number of cycles to get there from a present number of cycles is determined. The number of cycles left to reach registered end-of-life limit value is determined.

In some aspects, one or more of the following EoL parameters may be determined by the EoL predictor 1 and used for the EoL prediction: power contact stick duration (actual sample stick duration): average power contact stick duration (mean, average, rms, etc.); average speed of power contact electrode stick duration (SoPCESD) increase (contact electrode surface decay): and average acceleration of power contact stick duration increase (speed of decay).

In some aspects, SoPCESD is based on time differential of average stick duration for sampling windows and cycle differential of the number of cycles in the corresponding windows. Put another way, SoPCESD=d(TavgW2−TavgW1)/d(Ncycles2−Ncycles1), where TavgW1 is the stick duration average for sampling window W1, TavgW2 is the stick duration average for sampling window W2, Ncycles1 is the number of power contact cycles for W1. Ncycles2 is the number of power contact cycles for W2.

In some aspects, acceleration of power contact electrode surface degradation (AoPCESD) may be represented as AoPCESD=d(SavgW2−SavgW1)/d(Ncycles2−Ncycles1), where SavgW1 is the stick speed average for sampling window W1. SavgW2 is the stick speed average for sampling window W2, Ncycles1 is the number of power contact cycles for W1, and Ncycles2 is the number of power contact cycles for W2.

In some aspects, the power contact EoL predictor 1 registers may be located internally or externally to the controller 18. For example, the code control chip 120 can be configured to store the power contact EoL predictor 1 registers that are described hereinbelow.

In some aspects, address and data may be written into or read back from the registers through a communication interface using either UART. SPI or any other processor communication method.

In some aspects, the registers may contain data for the following operations: calculating may be understood to involve performing mathematical operations; controlling may be understood to involve processing input data to produce desired output data; detecting may be understood to involve noticing or otherwise detecting a change in the steady state; indicating may be understood to involve issuing notifications to the users; logging may be understood to involve associating dates, times, and events; measuring may be understood to involve acquiring data values about physical parameters; monitoring may be understood to involve observing the steady states for changes; processing may be understood to involve performing controller or processor-tasks for one or more events; and recording may be understood to involve writing and storing events of interest into mapped registers.

In some aspects, the power contact EoL predictor 1 registers may contain data arrays, data bits, data bytes, data matrixes, data pointers, data ranges, and data values.

In some aspects, the power contact EoL predictor 1 registers may store control data, default data, functional data, historical data, operational data, and statistical data. In some aspects, the power contact EoL predictor 1 registers may include authentication information, encryption information, processing information, production information, security information, and verification information. In some aspects, the power contact EoL predictor 1 registers may be used in connection with external control, external data processing, factory use, future use, internal control, internal data processing, and user tasks.

In some aspects, reading a specific register byte, bytes, or bits may reset the value to zero (0).

The following are example registers that can be configured for the power contact EoL predictor 1.

In some aspects, a mode register (illustrated in TABLE 1) may be configured to contain the data bits for the selected sequencer mode. For example, the power contact EoL predictor 1 may be preloaded with register default settings. In the default mode, the power contact EoL predictor 1 may operate stand-alone and independently as instructed by the factory default settings.

In some aspects, the following Read and Write commands may be used in connection with the mode register: Read @ 0x60, and Write @ 0x20.

TABLE 1

| Mode Register | BIT NUMBER | | | | | | | |
|---|---|---|---|---|---|---|---|---|
| FUNCTION | 7 | 6 | 6 | 4 | 3 | 2 | 1 | 0 |
| INDICATE_FAULTS & FAILURES | 1 | — | — | — | — | — | — | — |
| None | 0 | — | — | — | — | — | — | — |
| INDICATE_NONE | — | 1 | — | — | — | — | — | — |
| None | — | 0 | — | — | — | — | — | — |
| INDICATE_ALL | — | — | 1 | — | — | — | — | — |
| None | — | — | 0 | — | — | — | — | — |
| STOP_ON_FAILURE | — | — | — | 1 | — | — | — | — |
| None | — | — | — | 0 | — | — | — | — |
| HALT_ON_FAULT | — | — | — | — | 1 | — | — | — |
| None | — | — | — | — | 0 | — | — | — |
| RESET | — | — | — | — | — | 1 | — | — |
| None | — | — | — | — | — | 0 | — | — |
| CLEAR | — | — | — | — | — | — | 1 | — |
| None | — | — | — | — | — | — | 0 | — |
| DEFAULT | — | — | — | — | — | — | — | 1 |
| None | — | — | — | — | — | — | — | 0 |

In some aspects, an alert register (illustrated in TABLE 2) may be configured to contain the data bits for the selected alert method.

In some aspects, the following Read and Write commands may be used in connection with the alert register: Read @ 0x61, and Write @ 0x21.

TABLE 2

| Alert Register | BIT NUMBER | | | | | | | |
|---|---|---|---|---|---|---|---|---|
| FUNCTION | 7 | 6 | 5 | 4 | 3 | 2 | 1 | 0 |
| VOICE | 1 | — | — | — | — | — | — | — |
| None | 0 | — | — | — | — | — | — | — |
| COMM | — | 1 | — | — | — | — | — | — |
| None | — | 0 | — | — | — | — | — | — |
| BUZZER | — | — | 1 | — | — | — | — | — |
| None | — | — | 0 | — | — | — | — | — |
| SPEAKER | — | — | — | 1 | — | — | — | — |
| None | — | — | — | 0 | — | — | — | — |
| RECORD | — | — | — | — | 1 | — | — | — |
| None | — | — | — | — | 0 | — | — | — |
| SOUND | — | — | — | — | — | 1 | — | — |
| None | — | — | — | — | — | 0 | — | — |
| DISPLAY | — | — | — | — | — | — | 1 | — |
| None | — | — | — | — | — | — | 0 | — |
| LED | — | — | — | — | — | — | — | 1 |
| None | — | — | — | — | — | — | — | 0 |

In some aspects, a code control register (illustrated in TABLE 3) may be configured to contain the data array pointers for the selected code type.

In some aspects, the following Read and Write commands may be used in connection with the code control register: Read @ 0x62, and Write @ 0x22.

TABLE 3

| Code Control Register | BIT NUMBER | | | | | | | |
|---|---|---|---|---|---|---|---|---|
| FUNCTION | 7 | 6 | 5 | 4 | 3 | 2 | 1 | 0 |
| CHECKSUM | 1 | — | — | — | — | — | — | — |
| None | 0 | — | — | — | — | — | — | — |
| VALIDATION | — | 1 | — | — | — | — | — | — |
| None | — | 0 | — | — | — | — | — | — |
| LICENSE | — | — | 1 | — | — | — | — | — |
| None | — | — | 0 | — | — | — | — | — |
| CHIP | — | — | — | 1 | — | — | — | — |
| None | — | — | — | 0 | — | — | — | — |
| ENCRYPT | — | — | — | — | 1 | — | — | — |
| None | — | — | — | — | 0 | — | — | — |
| AUTHENTIC | — | — | — | — | — | 1 | — | — |
| None | — | — | — | — | — | 0 | — | — |
| ALERT | — | — | — | — | — | — | 1 | — |
| None | — | — | — | — | — | — | 0 | — |
| ACCESS | — | — | — | — | — | — | — | 1 |
| None | — | — | — | — | — | — | — | 0 |

In some aspects, a contact limits register (illustrated in TABLE 4) may be configured to contain the data array pointers for the selected contact limit specification.

In some aspects, the following Read and Write commands may be used in connection with the contact limits register: Read @ 0x63, and Write @ 0x23.

TABLE 4

| Contact Limits Register | BIT NUMBER | | | | | | | |
|---|---|---|---|---|---|---|---|---|
| FUNCTION | 7 | 6 | 5 | 4 | 3 | 2 | 1 | 0 |
| MAX_MECH_LIFE | 1 | — | — | — | — | — | — | — |
| None | 0 | — | — | — | — | — | — | — |
| MAX_ELEC_LIFE | — | 1 | — | — | — | — | — | — |
| None | — | 0 | — | — | — | — | — | — |
| MAX_CYCLES_PER_MINUTE | — | — | 1 | — | — | — | — | — |
| None | — | — | 0 | — | — | — | — | — |
| MAX_DUTY_CYCLE | — | — | — | 1 | — | — | — | — |
| None | — | — | — | 0 | — | — | — | — |
| MIN_DUTY_CYCLE | — | — | — | — | 1 | — | — | — |
| None | — | — | — | — | 0 | — | — | — |

TABLE 4-continued

| Contact Limits Register | BIT NUMBER | | | | | | | |
|---|---|---|---|---|---|---|---|---|
| FUNCTION | 7 | 6 | 5 | 4 | 3 | 2 | 1 | 0 |
| MIN_OFF_DURATION | — | — | — | — | — | 1 | — | — |
| None | — | — | — | — | — | 0 | — | — |
| MIN_ON_DURATION | — | — | — | — | — | — | 1 | — |
| None | — | — | — | — | — | — | 0 | — |
| MIN_CYCLE_TIME | — | — | — | — | — | — | — | 1 |
| None | — | — | — | — | — | — | — | 0 |

In some aspects, a data communication register (illustrated in TABLE 5) may be configured to contain the data bits for the selected data communications method.

In some aspects, the following Read and Write commands may be used in connection with the data communication register: Read @ 0x64; and Write @0x24.

TABLE 5

| Data Comm Register | BIT NUMBER | | | | | | | |
|---|---|---|---|---|---|---|---|---|
| FUNCTION | 7 | 6 | 5 | 4 | 3 | 2 | 1 | 0 |
| PROTOCOL | 1 | — | — | — | — | — | — | — |
| None | 0 | — | — | — | — | — | — | — |
| HMI | — | 1 | — | — | — | — | — | — |
| None | — | 0 | — | — | — | — | — | — |
| BLUETOOTH | — | — | 1 | — | — | — | — | — |
| None | — | — | 0 | — | — | — | — | — |
| ETHERNET | — | — | — | 1 | — | — | — | — |
| None | — | — | — | 0 | — | — | — | — |
| WIFI | — | — | — | — | 1 | — | — | — |
| None | — | — | — | — | 0 | — | — | — |
| USB | — | — | — | — | — | 1 | — | — |
| None | — | — | — | — | — | 0 | — | — |
| SPI | — | — | — | — | — | — | 1 | — |
| None | — | — | — | — | — | — | 0 | — |
| UART | — | — | — | — | — | — | — | 1 |
| None | — | — | — | — | — | — | — | 0 |

In some aspects, a coil driver parameter register (illustrated in TABLE 6) may be configured to contain the data array pointers for the selected coil driver parameter specification.

In some aspects, the following Read and Write commands may be used in connection with the coil driver parameter register: Read @ 0x65, and Write @0x25.

TABLE 6

| Coil Driver Parameters Register | BIT NUMBER | | | | | | | |
|---|---|---|---|---|---|---|---|---|
| FUNCTION | 7 | 6 | 5 | 4 | 3 | 2 | 1 | 0 |
| COIL_DRIVER_PATTERN | 1 | — | — | — | — | — | — | — |
| None | 0 | — | — | — | — | — | — | — |
| COIL_DRIVER_OFF_CHATTER | — | 1 | — | — | — | — | — | — |
| None | — | 0 | — | — | — | — | — | — |
| COIL_DRIVER_ON_CHATTER | — | — | 1 | — | — | — | — | — |
| None | — | — | 0 | — | — | — | — | — |
| COIL_DRIVER_FREQUENCY | — | — | — | 1 | — | — | — | — |
| None | — | — | — | 0 | — | — | — | — |
| COIL_DRIVER_CYCLE_TIME | — | — | — | — | 1 | — | — | — |
| None | — | — | — | — | 0 | — | — | — |
| COIL_DRIVER_DUTY_CYCLE | — | — | — | — | — | 1 | — | — |
| None | — | — | — | — | — | 0 | — | — |
| COIL_DRIVER_ON_DURATION | — | — | — | — | — | — | 1 | — |
| None | — | — | — | — | — | — | 0 | — |
| COIL_DRIVER_OFF_DURATION | — | — | — | — | — | — | — | 1 |
| None | — | — | — | — | — | — | — | 0 |

In some aspects, a coil driver pattern register (illustrated in TABLE 7) may be configured to contain the data bits for the selected coil driver pattern condition.

In some aspects, the following Read and Write commands may be used in connection with the coil driver pattern register: Read @ 0x66, and Write @ 0x26.

TABLE 7

| Coil Driver Pattern Register | BIT NUMBER | | | | | | | |
|---|---|---|---|---|---|---|---|---|
| FUNCTION | 7 | 6 | 5 | 4 | 3 | 2 | 1 | 0 |
| COIL_DRIVER_PATTERN_AQUIRED | 1 | — | — | — | — | — | — | — |
| None | 0 | — | — | — | — | — | — | — |
| COIL_DRIVER_PATTERN_DETECTED | — | 1 | — | — | — | — | — | — |
| None | — | 0 | — | — | — | — | — | — |
| COIL_DRIVER_PATTERN_LEARNED | — | — | 1 | — | — | — | — | — |
| None | — | — | 0 | — | — | — | — | — |
| OUT_OF_COIL_DRIVER_PATTERN | — | — | — | 1 | — | — | — | — |
| None | — | — | — | 0 | — | — | — | — |
| IN_COIL_DRIVER_PATTERN | — | — | — | — | 1 | — | — | — |
| None | — | — | — | — | 0 | — | — | — |
| NO_COIL_DRIVER_PATTERN | — | — | — | — | — | 1 | — | — |
| None | — | — | — | — | — | 0 | — | — |
| AQUIRE_COIL_DRIVER_PATTERN | — | — | — | — | — | — | 1 | — |
| None | — | — | — | — | — | — | 0 | — |
| IGNORE_COIL_DRIVER_PATTERN | — | — | — | — | — | — | — | 1 |
| None | — | — | — | — | — | — | — | 0 |

In some aspects, a dry coil output delay timer register (illustrated in TABLE 8) may be configured to contain the values for the dry delay timing.

In some aspects, the following Read and Write commands may be used in connection with the dry relay register: Read @ 0x67, and Write @ 0x27.

TABLE 8

| Dry Coil Output Delay Time Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a fault register (illustrated in TABLE 9) may be configured to contain the data bits for the selected fault condition.

In some aspects, the following Read and Write commands may be used in connection with the fault register: Read @ 0x68, and Write @ 0x28.

TABLE 9

| Fault Register | BIT NUMBER | | | | | | | |
|---|---|---|---|---|---|---|---|---|
| FUNCTION | 7 | 6 | 5 | 4 | 3 | 2 | 1 | 0 |
| COMM_FAULT | 1 | — | — | — | — | — | — | — |
| None | 0 | — | — | — | — | — | — | — |
| POWER_BROWN_OUT | — | 1 | — | — | — | — | — | — |
| None | — | 0 | — | — | — | — | — | — |
| WATCH_DOG_TIMER | — | — | 1 | — | — | — | — | — |
| None | — | — | 0 | — | — | — | — | — |
| POWER_FAULT | — | — | — | 1 | — | — | — | — |
| None | — | — | — | 0 | — | — | — | — |
| DEVICE_HEALTH | — | — | — | — | 1 | — | — | — |
| None | — | — | — | — | 0 | — | — | — |
| COIL_DRIVER_FAULT | — | — | — | — | — | 1 | — | — |
| None | — | — | — | — | — | 0 | — | — |
| DRY_COIL_FAULT | — | — | — | — | — | — | 1 | — |
| None | — | — | — | — | — | — | 0 | — |

TABLE 9-continued

| Fault Register | BIT NUMBER | | | | | | | |
|---|---|---|---|---|---|---|---|---|
| FUNCTION | 7 | 6 | 5 | 4 | 3 | 2 | 1 | 0 |
| WET_COIL_FAULT | — | — | — | — | — | — | — | 1 |
| None | — | — | — | — | — | — | — | 0 |

In some aspects, a flash code register (illustrated in TABLE 10) may be configured to contain the data bits for the selected LED flash code colors.

In some aspects, the following Read and Write commands may be used in connection with the flash code register: Read @ 0x69, and Write @ 0x29.

TABLE 10

| LED Flash Code Register | BIT NUMBER | | | | | | | |
|---|---|---|---|---|---|---|---|---|
| FUNCTION | 7 | 6 | 5 | 4 | 3 | 2 | 1 | 0 |
| FLASH_CODE7 | 1 | — | — | — | — | — | — | — |
| None | 0 | — | — | — | — | — | — | — |
| FLASH_CODE6 | — | 1 | — | — | — | — | — | — |
| None | — | 0 | — | — | — | — | — | — |
| FLASH_CODE5 | — | — | 1 | — | — | — | — | — |
| None | — | — | 0 | — | — | — | — | — |
| FLASH_CODE4 | — | — | — | 1 | — | — | — | — |
| None | — | — | — | 0 | — | — | — | — |
| FLASH_CODE3 | — | — | — | — | 1 | — | — | — |
| None | — | — | — | — | 0 | — | — | — |
| FLASH_CODE2 | — | — | — | — | — | 1 | — | — |
| None | — | — | — | — | — | 0 | — | — |
| FLASH_CODE1 | — | — | — | — | — | — | 1 | — |
| None | — | — | — | — | — | — | 0 | — |
| FLASH_CODE0 | — | — | — | — | — | — | — | 1 |
| None | — | — | — | — | — | — | — | 0 |

In some aspects, a history register (illustrated in TABLE 11) may be configured to contain the data array pointers for the selected history information.

In some aspects, the following Read and Write commands may be used in connection with the history register: Read @ 0x6 A. and Write @ 0x2 A.

TABLE 11

| History Register | BIT NUMBER | | | | | | | |
|---|---|---|---|---|---|---|---|---|
| FUNCTION | 7 | 6 | 5 | 4 | 3 | 2 | 1 | 0 |
| STATUS | 1 | — | — | — | — | — | — | — |
| None | 0 | — | — | — | — | — | — | — |
| STATE | — | 1 | — | — | — | — | — | — |
| None | — | 0 | — | — | — | — | — | — |
| MODE | — | — | 1 | — | — | — | — | — |
| None | — | — | 0 | — | — | — | — | — |
| FAULT | — | — | — | 1 | — | — | — | — |
| None | — | — | — | 0 | — | — | — | — |
| OUTPUT | — | — | — | — | 1 | — | — | — |
| None | — | — | — | — | 0 | — | — | — |
| INPUT | — | — | — | — | — | 1 | — | — |
| None | — | — | — | — | — | 0 | — | — |
| DRIVER | — | — | — | — | — | — | 1 | — |
| None | — | — | — | — | — | — | 0 | — |
| MODE | — | — | — | — | — | — | — | 1 |
| None | — | — | — | — | — | — | — | 0 |

In some aspects, an input register (illustrated in TABLE 12) may be configured to contain the data bits for the selected input status.

In some aspects, the following Read and Write commands may be used in connection with the input register: Read @ 0x6B, and Write @ 0x2B.

TABLE 12

| Input Register | BIT NUMBER | | | | | | | |
|---|---|---|---|---|---|---|---|---|
| FUNCTION | 7 | 6 | 5 | 4 | 3 | 2 | 1 | 0 |
| DCI | 1 | — | — | — | — | — | — | — |
| None | 0 | — | — | — | — | — | — | — |
| WCI | — | 1 | — | — | — | — | — | — |
| None | — | 0 | — | — | — | — | — | — |
| RXD | — | — | 1 | — | — | — | — | — |
| None | — | — | 0 | — | — | — | — | — |
| S2C | — | — | — | 1 | — | — | — | — |
| None | — | — | — | 0 | — | — | — | — |
| S2B | — | — | — | — | 1 | — | — | — |
| None | — | — | — | — | 0 | — | — | — |
| S2A | — | — | — | — | — | 1 | — | — |
| None | — | — | — | — | — | 0 | — | — |
| S1 | — | — | — | — | — | — | 1 | — |
| None | — | — | — | — | — | — | 0 | — |
| CDI | — | — | — | — | — | — | — | 1 |
| None | — | — | — | — | — | — | — | 0 |

In some aspects, an LED color register (illustrated in TABLE 13) may be configured to contain the data bits for the selected LED color.

In some aspects, the following Read and Write commands may be used in connection with the LED color register: Read @ 0x6C. and Write @ 0x2C.

TABLE 13

| LED Color Register | BIT NUMBER | | | | | | | |
|---|---|---|---|---|---|---|---|---|
| FUNCTION | 7 | 6 | 5 | 4 | 3 | 2 | 1 | 0 |
| RED | 1 | — | — | — | — | — | — | — |
| None | 0 | — | — | — | — | — | — | — |
| RED_ORANGE | — | 1 | — | — | — | — | — | — |
| None | — | 0 | — | — | — | — | — | — |
| ORANGE_YELLOW | — | — | 1 | — | — | — | — | — |
| None | — | — | 0 | — | — | — | — | — |
| ORANGE | — | — | — | 1 | — | — | — | — |
| None | — | — | — | 0 | — | — | — | — |
| YELLOW | — | — | — | — | 1 | — | — | — |
| None | — | — | — | — | 0 | — | — | — |
| YELLOW_GREEN | — | — | — | — | — | 1 | — | — |
| None | — | — | — | — | — | 0 | — | — |
| GREEN_YELLOW | — | — | — | — | — | — | 1 | — |
| None | — | — | — | — | — | — | 0 | — |
| GREEN | — | — | — | — | — | — | — | 1 |
| None | — | — | — | — | — | — | — | 0 |

In some aspects, an output register (illustrated in TABLE 14) may be configured to contain the data bit for the selected output status.

In some aspects, the following Read and Write commands may be used in connection with the output register: Read @ 0x6D, and Write @ 0x2D.

TABLE 14

| Output Register | BIT NUMBER | | | | | | | |
|---|---|---|---|---|---|---|---|---|
| FUNCTION | 7 | 6 | 5 | 4 | 3 | 2 | 1 | 0 |
| WET_COIL_OUTPUT | 1 | — | — | — | — | — | — | — |
| None | 0 | — | — | — | — | — | — | — |
| DRY_COIL_OUTPUT | — | 1 | — | — | — | — | — | — |
| None | — | 0 | — | — | — | — | — | — |
| TXD | — | — | 1 | — | — | — | — | — |
| None | — | — | 0 | — | — | — | — | — |
| ARC_SUPPRESSOR_LOCK | — | — | — | 1 | — | — | — | — |
| None | — | — | — | 0 | — | — | — | — |
| Reserved | — | — | — | — | 1 | — | — | — |
| None | — | — | — | — | 0 | — | — | — |

TABLE 14-continued

| Output Register | BIT NUMBER | | | | | | | |
|---|---|---|---|---|---|---|---|---|
| FUNCTION | 7 | 6 | 5 | 4 | 3 | 2 | 1 | 0 |
| SIGNAL_INDICATOR_OUTPUT2 | — | — | — | — | — | 1 | — | — |
| None | — | — | — | — | — | 0 | — | — |
| SIGNAL_INDICATOR_OUTPUT1 | — | — | — | — | — | — | 1 | — |
| None | — | — | — | — | — | — | 0 | — |
| Reserved | — | — | — | — | — | — | — | 1 |
| None | — | — | — | — | — | — | — | 0 |

In some aspects, a state register (illustrated in TABLE 15) may be configured to contain the data array pointers for the selected state information.

In some aspects, the following Read and Write commands may be used in connection with the state register: Read @ 0x6E, and Write @ 0x2E.

TABLE 15

| State Register | BIT NUMBER | | | | | | | |
|---|---|---|---|---|---|---|---|---|
| FUNCTION | 7 | 6 | 5 | 4 | 3 | 2 | 1 | 0 |
| WET_COIL_ON | 1 | — | — | — | — | — | — | — |
| None | 0 | — | — | — | — | — | — | — |
| WET_COIL_OPN | — | 1 | — | — | — | — | — | — |
| None | — | 0 | — | — | — | — | — | — |
| WET_COIL_OFF | — | — | 1 | — | — | — | — | — |
| None | — | — | 0 | — | — | — | — | — |
| DRY_COIL_ON | — | — | — | 1 | — | — | — | — |
| None | — | — | — | 0 | — | — | — | — |
| DRY_COIL_OPN | — | — | — | — | 1 | — | — | — |
| None | — | — | — | — | 0 | — | — | — |
| DRY_COIL_OFF | — | — | — | — | — | 1 | — | — |
| None | — | — | — | — | — | 0 | — | — |
| DRIVER_INPUT_ON | — | — | — | — | — | — | 1 | — |
| None | — | — | — | — | — | — | 0 | — |
| DRIVER_INPUT_OFF | — | — | — | — | — | — | — | 1 |
| None | — | — | — | — | — | — | — | 0 |

In some aspects, a statistics register (illustrated in TABLE 16) may be configured to contain the data array pointers for the selected statistics information.

In some aspects, the following Read and Write commands may be used in connection with the statistics register: Read @ 0x6F; and Write @ 0x2F.

TABLE 16

| Statistics Register | BIT NUMBER | | | | | | | |
|---|---|---|---|---|---|---|---|---|
| FUNCTION | 7 | 6 | 5 | 4 | 3 | 2 | 1 | 0 |
| STATUS | 1 | — | — | — | — | — | — | — |
| None | 0 | — | — | — | — | — | — | — |
| STATE | — | 1 | — | — | — | — | — | — |
| None | — | 0 | — | — | — | — | — | — |
| MODE | — | — | 1 | — | — | — | — | — |
| None | — | — | 0 | — | — | — | — | — |
| FAULT | — | — | — | 1 | — | — | — | — |
| None | — | — | — | 0 | — | — | — | — |
| OUTPUT | — | — | — | — | 1 | — | — | — |
| None | — | — | — | — | 0 | — | — | — |
| INPUT | — | — | — | — | — | 1 | — | — |
| None | — | — | — | — | — | 0 | — | — |
| DRIVER | — | — | — | — | — | — | 1 | — |
| None | — | — | — | — | — | — | 0 | — |
| MODE | — | — | — | — | — | — | — | 1 |
| None | — | — | — | — | — | — | — | 0 |

In some aspects, a status register (illustrated in TABLE 17) may be configured to contain the data array pointers for the selected status information.

In some aspects, the following Read and Write commands may be used in connection with the status register: Read @ 0x70, and Write @ 0x30.

TABLE 17

| Status Register | BIT NUMBER | | | | | | | |
|---|---|---|---|---|---|---|---|---|
| FUNCTION | 7 | 6 | 5 | 4 | 3 | 2 | 1 | 0 |
| CYCLE_COUNT | 1 | — | — | — | — | — | — | — |
| None | 0 | — | — | — | — | — | — | — |
| OPERATION_HALTED | — | 1 | — | — | — | — | — | — |
| None | — | 0 | — | — | — | — | — | — |
| SYSTEM_READY | — | — | 1 | — | — | — | — | — |
| None | — | — | 0 | — | — | — | — | — |
| FAILURES | — | — | — | 1 | — | — | — | — |
| None | — | — | — | 0 | — | — | — | — |
| FAILURE | — | — | — | — | 1 | — | — | — |
| None | — | — | — | — | 0 | — | — | — |
| FAULTS | — | — | — | — | — | 1 | — | — |
| None | — | — | — | — | — | 0 | — | — |
| FAU T | — | — | — | — | — | — | 1 | — |
| None | — | — | — | — | — | — | 0 | — |
| ALL_SYSTEMS_OK | — | — | — | — | — | — | — | 1 |
| None | — | — | — | — | — | — | — | 0 |

In some aspects, a version register (illustrated in TABLE 18) may be configured to contain the data array pointers for the version information.

In some aspects, the following Read and Write commands may be used in connection with the version register: Read @ 0x71, and Write @ 0x31.

TABLE 18

| Version Register | BIT NUMBER | | | | | | | |
|---|---|---|---|---|---|---|---|---|
| FUNCTION | 7 | 6 | 5 | 4 | 3 | 2 | 1 | 0 |
| PCB_REVISION | 1 | — | — | — | — | — | — | — |
| None | 0 | — | — | — | — | — | — | — |
| ASSEMBLY_REVISION | — | 1 | — | — | — | — | — | — |
| None | — | 0 | — | — | — | — | — | — |
| DATE_CODE | — | — | 1 | — | — | — | — | — |
| None | — | — | 0 | — | — | — | — | — |
| LOT_NUMBER | — | — | — | 1 | — | — | — | — |
| None | — | — | — | 0 | — | — | — | — |
| SERIAL_NUMBER | — | — | — | — | 1 | — | — | — |
| None | — | — | — | — | 0 | — | — | — |
| HARDWARE_VERSION | — | — | — | — | — | 1 | — | — |
| None | — | — | — | — | — | 0 | — | — |
| SOFTWARE_VERSION | — | — | — | — | — | — | 1 | — |
| None | — | — | — | — | — | — | 0 | — |
| FIRMWARE_VERSION | — | — | — | — | — | — | — | 1 |
| None | — | — | — | — | — | — | — | 0 |

In some aspects, a wet coil output delay timer register (illustrated in TABLE 19) may be configured to contain the values for the wet delay timing.

In some aspects, the following Read and Write commands may be used in connection with the wet coil output delay timer register: Read @ 0x72, and Write @ 0x32.

TABLE 19

| Wet Coil Output Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 2550 ms | 1 | 1 | 1 | 1 | 1 | 1 | 1 | 1 |
| Default: 100 ms | 0 | 0 | 0 | 0 | 1 | 0 | 1 | 0 |
| Minimum: 0 ms | 0 | 0 | 0 | 0 | 0 | 0 | 0 | 0 |

In some aspects, a switch debounce timer register (illustrated in TABLE 20) may be configured to contain the values for the switch debounce timing.

In some aspects, the following Read and Write commands may be used in connection with the switch debounce timer register: Read @ 0x73, and Write @0x33.

TABLE 20

| Switch Debounce Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a receive data delay timer register (illustrated in TABLE 21) may be configured to contain one or more-byte value.

In some aspects, the following Read and Write commands may be used in connection with the receive data delay timer register: Read @ 0x74, and Write @0x34.

TABLE 21

| Receive Data Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a transmit data delay timer register (illustrated in TABLE 22) may be configured to contain one or more-byte value.

In some aspects, the following Read and Write commands may be used in connection with the transmit data delay timer register: Read @ 0x75, and Write @ 0x35.

TABLE 22

| Transmit Data Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a wet coil current input delay timer register (illustrated in TABLE 23) may be configured to contain the values for the wet coil output timing.

In some aspects, the following Read and Write commands may be used in connection with the wet coil current input delay timer register: Read @ 0x76, and Write @ 0x36.

TABLE 23

| Wet Coil Current Input Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a dry coil current input delay timer register (illustrated in TABLE 24) may be configured to contain a one or more-byte value.

In some aspects, the following Read and Write commands may be used in connection with the dry coil current input delay timer register: Read @ 0x77, and Write @ 0x37.

TABLE 24

| Dry Coil Current Input Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a signal indicator output delay timer register (illustrated in TABLE 25) may be configured to contain a one or more-byte value.

In some aspects, the following Read and Write commands may be used in connection with the signal indicator output delay timer register: Read @ 0x78, and Write @ 0x38.

TABLE 25

| Signal Indicator Output Delay Timer Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Default: 10 ms | 0 | 0 | 0 | 0 | 1 | 0 | 1 | 0 |
| Minimum: 0 ms | 0 | 0 | 0 | 0 | 0 | 0 | 0 | 0 |

In some aspects, a sensor input register (illustrated in TABLE 26) may be configured to contain the data bits for the selected sensor status.

In some aspects, the following Read and Write commands may be used in connection with the sensor input register: Read @ 0x79, and Write @ 0x39.

TABLE 26

| Sensor Input Register | BIT NUMBER | | | | | | | |
|---|---|---|---|---|---|---|---|---|
| FUNCTION | 7 | 6 | 5 | 4 | 3 | 2 | 1 | 0 |
| Reserved | 1 | — | — | — | — | — | — | — |
| None | 0 | — | — | — | — | — | — | — |
| Reserved | — | 1 | — | — | — | — | — | — |
| None | — | 0 | — | — | — | — | — | — |
| Reserved | — | — | 1 | — | — | — | — | — |
| None | — | — | 0 | — | — | — | — | — |
| Reserved | — | — | — | 1 | — | — | — | — |
| None | — | — | — | 0 | — | — | — | — |
| COIL_SIGNAL_PRESENT | — | — | — | — | 1 | — | — | — |
| None | — | — | — | — | 0 | — | — | — |
| WET_CONTACT_CURRENT_SENSOR_BIT | — | — | — | — | — | 1 | — | — |
| None | — | — | — | — | — | 0 | — | — |
| WET_CONTACT_VOLTAGE_SENSOR_BIT | — | — | — | — | — | — | 1 | — |
| None | — | — | — | — | — | — | 0 | — |
| OCP_VOLTAGE_SENSOR_BIT | — | — | — | — | — | — | — | 1 |
| None | — | — | — | — | — | — | — | 0 |

In some aspects, an overcurrent protection voltage sensor register (illustrated in TABLE 27) may be configured to contain a one or more-byte value.

In some aspects, the following Read and Write commands may be used in connection with the overcurrent protection (OCP) voltage sensor register: Read @ 0x7 A, and Write @ 0x3 A.

TABLE 27

| OCP Voltage Sensor Register | BIT NUMBER | | | | | | | |
|---|---|---|---|---|---|---|---|---|
| VALUE | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum.: Min Volts | 0 | 0 | 0 | 0 | 0 | 0 | 0 | 0 |

In some aspects, a wet contact voltage sensor register (illustrated in TABLE 28) may be configured to contain a one or more-byte value. The value may be expressed for example but not limited to as average, mean, median, rms or peak.

In some aspects, the following Read and Write commands may be used in connection with the wet contact voltage sensor register: Read @ 0x7B. and Write @ 0x3B.

TABLE 28

| Wet Contact Voltage Sensor Register | BIT NUMBER | | | | | | | |
|---|---|---|---|---|---|---|---|---|
| VALUE | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum: Min Volts | 0 | 0 | 0 | 0 | 0 | 0 | 0 | 0 |

In some aspects, a wet contact current sensor register (illustrated in TABLE 29) may be configured to contain a one or more-byte value. The value may be expressed for example but not limited to as average, mean, median, rms or peak.

In some aspects, the following Read and Write commands may be used in connection with the wet contact current sensor register: Read @ 0x7C. and Write @ 0x3C.

TABLE 29

| Wet Contact Current Sensor Register | BIT NUMBER | | | | | | | |
|---|---|---|---|---|---|---|---|---|
| VALUE | 7 | 6 | 5 | 4 | 3 | 2 | 1 | 0 |
| Maximum: Max Amps | 1 | 1 | 1 | 1 | 1 | 1 | 1 | 1 |
| Default: none | x | x | x | x | x | x | x | x |
| Minimum: Min Amps | 0 | 0 | 0 | 0 | 0 | 0 | 0 | 0 |

In some aspects, a fault arc register (illustrated in TABLE 30) may be configured to contain the data bits for the selected sensor status.

In some aspects, the following Read and Write commands may be used in connection with the fault arc parameter register: Read @ 0x7D, and Write @0x3D.

TABLE 30

| Fault Arc Register | BIT NUMBER | | | | | | | |
|---|---|---|---|---|---|---|---|---|
| FUNCTION | 7 | 6 | 5 | 4 | 3 | 2 | 1 | 0 |
| FAULT_ARC_ENERGY | 1 | — | — | — | — | — | — | — |
| None | 0 | — | — | — | — | — | — | — |
| FAULT_ARC_DURATION | — | 1 | — | — | — | — | — | — |
| None | — | 0 | — | — | — | — | — | — |
| FAULT_ARC_POWER | — | — | 1 | — | — | — | — | — |
| None | — | — | 0 | — | — | — | — | — |
| FAULT_ARC_RESISTANCE_GRADIENT | — | — | — | 1 | — | — | — | — |
| None | — | — | — | 0 | — | — | — | — |
| FAULT_ARC_RESISTANCE | — | — | — | — | 1 | — | — | — |
| None | — | — | — | — | 0 | — | — | — |

TABLE 30-continued

| Fault Arc Register | BIT NUMBER | | | | | | | |
|---|---|---|---|---|---|---|---|---|
| FUNCTION | 7 | 6 | 5 | 4 | 3 | 2 | 1 | 0 |
| FAULT_ARC_CURRENT | — | — | — | — | — | 1 | — | — |
| None | — | — | — | — | — | 0 | — | — |
| FAULT_ARC_VOLTAGE_GRADIENT | — | — | — | — | — | — | 1 | — |
| None | — | — | — | — | — | — | 0 | — |
| FAULT_ARC_VOLTAGE | — | — | — | — | — | — | — | 1 |
| None | — | — | — | — | — | — | — | 0 |

In some aspects, an amperage trip point register (illustrated in TABLE 31) may be configured to contain the one or more-byte value for the specific trip point setting. The value may be expressed for example but not limited to as average, mean, median, rms or peak.

In some aspects, the following Read and Write commands may be used in connection with the amperage trip point register: Read @ 0x7E, and Write @0x3E.

TABLE 31

| AMPERAGE TRIP POINT REGSITER | BIT NUMBER | | | | | | | |
|---|---|---|---|---|---|---|---|---|
| VALUE | 7 | 6 | 5 | 4 | 3 | 2 | 1 | 0 |
| Maximum: Max Amps | 1 | 1 | 1 | 1 | 1 | 1 | 1 | 1 |
| Set-Amperage: none selected | x | x | x | x | x | x | x | x |
| Minimum: Min Amps | 0 | 0 | 0 | 0 | 0 | 0 | 0 | 0 |

In some aspects, an amperage trip delay register (illustrated in TABLE 32) may be configured to contain the one or more-byte value for the specific trip point setting. The value may be expressed for example but not limited to as average, mean, median, rms or peak.

In some aspects, the following Read and Write commands may be used in connection with the amperage trip delay register: Read @ 0x7F, and Write @0x3F.

TABLE 32

| Amperage Trip Delay Register | BIT NUMBER | | | | | | | |
|---|---|---|---|---|---|---|---|---|
| VALUE | 7 | 6 | 5 | 4 | 3 | 2 | 1 | 0 |
| Maximum: 255 ms | 1 | 1 | 1 | 1 | 1 | 1 | 1 | 1 |
| Set-Amperage Trip Delay: none selected | x | x | x | x | x | x | x | x |
| Minimum: 0 ms | 0 | 0 | 0 | 0 | 0 | 0 | 0 | 0 |

In some aspects, a fault arc voltage register (illustrated in TABLE 33) may be configured to contain a one or more-byte value. The value may be expressed for example but not limited to as average, mean, median, rms or peak.

In some aspects, the following Read and Write commands may be used in connection with the fault arc voltage register: Read @ 0x80, and Write @ 0x40.

TABLE 33

| Fault Arc Voltage Register | BIT NUMBER | | | | | | | |
|---|---|---|---|---|---|---|---|---|
| VALUE | 7 | 6 | 5 | 4 | 3 | 2 | 1 | 0 |
| Maximum: Max Volts | 1 | 1 | 1 | 1 | 1 | 1 | 1 | 1 |
| Default: none | x | x | x | x | x | x | x | x |
| Minimum: Min Volts | 0 | 0 | 0 | 0 | 0 | 0 | 0 | 0 |

In some aspects, a fault arc voltage gradient register (illustrated in TABLE 34) may be configured to contain a one or more-byte value. The value may be expressed for example but not limited to as average, mean, median, rms, and/or peak.

In some aspects, the following Read and Write commands may be used in connection with the fault arc voltage gradient register: Read @ 0x81, and Write @ 0x41.

TABLE 34

| Fault Arc Voltage Gradient Register | BIT NUMBER | | | | | | | |
|---|---|---|---|---|---|---|---|---|
| VALUE | 7 | 6 | 5 | 4 | 3 | 2 | 1 | 0 |
| Maximum: Max dV/dt | 1 | 1 | 1 | 1 | 1 | 1 | 1 | 1 |
| Default: none | x | x | x | x | x | x | x | x |
| Minimum: Min dV/dt | 0 | 0 | 0 | 0 | 0 | 0 | 0 | 0 |

In some aspects, a fault arc current register (illustrated in TABLE 35) may be configured to contain a one or more-byte value. The value may be expressed for example but not limited to as average, mean, median, rms, or peak.

In some aspects, the following Read and Write commands may be used in connection with the fault arc current register: Read @ 0x82, and Write @ 0x42.

TABLE 35

| Fault Arc Current Register | BIT NUMBER | | | | | | | |
|---|---|---|---|---|---|---|---|---|
| VALUE | 7 | 6 | 5 | 4 | 3 | 2 | 1 | 0 |
| Maximum: Max Amps | 1 | 1 | 1 | 1 | 1 | 1 | 1 | 1 |
| Default: none | x | x | x | x | x | x | x | x |
| Minimum: Min Amps | 0 | 0 | 0 | 0 | 0 | 0 | 0 | 0 |

In some aspects, a fault arc resistance register (illustrated in TABLE 36) may be configured to contain a one or more-byte value. The value may be expressed for example but not limited to as average, mean, median, rms or peak.

In some aspects, the following Read and Write commands may be used in connection with the fault arc resistance register: Read @ 0x83, and Write @0x43.

TABLE 36

| Fault Arc Resistance Register | BIT NUMBER | | | | | | | |
|---|---|---|---|---|---|---|---|---|
| VALUE | 7 | 6 | 5 | 4 | 3 | 2 | 1 | 0 |
| Maximum: Max Ohms | 1 | 1 | 1 | 1 | 1 | 1 | 1 | 1 |
| Default: none | x | x | x | x | x | x | x | x |
| Minimum: Min Ohms | 0 | 0 | 0 | 0 | 0 | 0 | 0 | 0 |

In some aspects, a fault arc resistance gradient register (illustrated in TABLE 37) may be configured to contain a one or more-byte value. The value may be expressed for example but not limited to as average, mean, median, rms, or peak.

In some aspects, the following Read and Write commands may be used in connection with the fault arc resistance gradient register: Read @ 0x84, and Write @ 0x44.

TABLE 37

| Fault Arc Resistance Gradient Register | BIT NUMBER | | | | | | | |
|---|---|---|---|---|---|---|---|---|
| VALUE | 7 | 6 | 5 | 4 | 3 | 2 | 1 | 0 |
| Maximum: Max dΩ/dt | 1 | 1 | 1 | 1 | 1 | 1 | 1 | 1 |
| Default: none | x | x | x | x | x | x | x | x |
| Minimum: Min dΩ/dt | 0 | 0 | 0 | 0 | 0 | 0 | 0 | 0 |

In some aspects, a fault arc power register (illustrated in TABLE 38) may be configured to contain a one or more-byte value. The value may be expressed for example but not limited to as average, mean, median, rms or peak.

In some aspects, the following Read and Write commands may be used in connection with the fault arc power register: Read @ 0x85, and Write @ 0x45.

TABLE 38

| Fault Arc Power Register | BIT NUMBER | | | | | | | |
|---|---|---|---|---|---|---|---|---|
| VALUE | 7 | 6 | 5 | 4 | 3 | 2 | 1 | 0 |
| Maximum: Max Watts | 1 | 1 | 1 | 1 | 1 | 1 | 1 | 1 |
| Default: none | x | x | x | x | x | x | x | x |
| Minimum: Min Watts | 0 | 0 | 0 | 0 | 0 | 0 | 0 | 0 |

In some aspects, a fault arc duration register (illustrated in TABLE 39) may be configured to contain a one or more-byte value. The value may be expressed for example but not limited to as average, mean, median, rms, or peak.

In some aspects, the following Read and Write commands may be used in connection with the fault arc duration register: Read @ 0x86, and Write @ 0x46.

TABLE 39

| Fault Arc DurationRegister | BIT NUMBER | | | | | | | |
|---|---|---|---|---|---|---|---|---|
| VALUE | 7 | 6 | 5 | 4 | 3 | 2 | 1 | 0 |
| Maximum: Max seconds | 1 | 1 | 1 | 1 | 1 | 1 | 1 | 1 |
| Default: none | x | x | x | x | x | x | x | x |
| Minimum: Min seconds | 0 | 0 | 0 | 0 | 0 | 0 | 0 | 0 |

In some aspects, a fault arc energy register (illustrated in TABLE 40) may be configured to contain a one or more-byte value. The value may be expressed for example but not limited to as average, mean, median, rms or peak.

In some aspects, the following Read and Write commands may be used in connection with the fault arc energy register: Read @ 0x87, and Write @ 0x47.

TABLE 40

| Fault Arc Energy Register | BIT NUMBER | | | | | | | |
|---|---|---|---|---|---|---|---|---|
| VALUE | 7 | 6 | 5 | 4 | 3 | 2 | 1 | 0 |
| Maximum: Max Joules | 1 | 1 | 1 | 1 | 1 | 1 | 1 | 1 |
| Default: none | x | x | x | x | x | x | x | x |
| Minimum: Min Joules | 0 | 0 | 0 | 0 | 0 | 0 | 0 | 0 |

In some aspects, a break arc register (illustrated in TABLE 41) may be configured to contain a one or more-byte value. In some aspects, the following Read and Write commands may be used in connection with the break arc register: Read @ 0x88, and Write @ 0x48.

TABLE 41

| Break Arc Register | BIT NUMBER | | | | | | | |
|---|---|---|---|---|---|---|---|---|
| FUNCTION | 7 | 6 | 5 | 4 | 3 | 2 | 1 | 0 |
| BREAK_ARC_ENERGY | 1 | — | — | — | — | — | — | — |
| None | 0 | — | — | — | — | — | — | — |
| BREAK_ARC_DURATION | — | 1 | — | — | — | — | — | — |
| None | — | 0 | — | — | — | — | — | — |
| BREAK_ARC_POWER | — | — | 1 | — | — | — | — | — |
| None | — | — | 0 | — | — | — | — | — |
| BREAK_ARC_RESISTANCE_GRADIENT | — | — | — | 1 | — | — | — | — |
| None | — | — | — | 0 | — | — | — | — |
| BREAK_ARC_RESISTANCE | — | — | — | — | 1 | — | — | — |
| None | — | — | — | — | 0 | — | — | — |
| BREAK_ARC_CURRENT | — | — | — | — | — | 1 | — | — |
| None | — | — | — | — | — | 0 | — | — |
| BREAK_ARC_VOLTAGE_GRADIENT | — | — | — | — | — | — | 1 | — |
| None | — | — | — | — | — | — | 0 | — |
| BREAK_ARC_VOLTAGE | — | — | — | — | — | — | — | 1 |
| None | — | — | — | — | — | — | — | 0 |

In some aspects, a make arc register (illustrated in TABLE 42) may be configured to contain a one or more-byte value. In some aspects, the following Read and Write commands may be used in connection with the make arc register: Read @ 0x89, and Write @ 0x49.

TABLE 42

| Make Arc Register | BIT NUMBER | | | | | | | |
|---|---|---|---|---|---|---|---|---|
| FUNCTION | 7 | 6 | 5 | 4 | 3 | 2 | 1 | 0 |
| MAKE_ARC_ENERGY | 1 | — | — | — | — | — | — | — |
| None | 0 | — | — | — | — | — | — | — |
| MAKE_ARC_DURATION | — | 1 | — | — | — | — | — | — |
| None | — | 0 | — | — | — | — | — | — |
| MAKE_ARC_POWER | — | — | 1 | — | — | — | — | — |
| None | — | — | 0 | — | — | — | — | — |
| MAKE_ARC_RESISTANCE_GRADIENT | — | — | — | 1 | — | — | — | — |
| None | — | — | — | 0 | — | — | — | — |
| MAKE_ARC_RESISTANCE | — | — | — | — | 1 | — | — | — |
| None | — | — | — | — | 0 | — | — | — |
| MAKE_ARC_CURRENT | — | — | — | — | — | 1 | — | — |
| None | — | — | — | — | — | 0 | — | — |
| MAKE_ARC_VOLTAGE_GRADIENT | — | — | — | — | — | — | 1 | — |
| None | — | — | — | — | — | — | 0 | — |
| MAKE_ARC_VOLTAGE | — | — | — | — | — | — | — | 1 |
| None | — | — | — | — | — | — | — | 0 |

In some aspects, a contact register (illustrated in TABLE 43) may be configured to contain a one or more-byte value. In some aspects, the following Read and Write commands may be used in connection with the contact register: Read @ 0x8 A. and Write @ 0x4 A.

TABLE 43

| Contact Register | BIT NUMBER | | | | | | | |
|---|---|---|---|---|---|---|---|---|
| FUNCTION | 7 | 6 | 5 | 4 | 3 | 2 | 1 | 0 |
| CONTACT_HISTORY | 1 | — | — | — | — | — | — | — |
| None | 0 | — | — | — | — | — | — | — |
| CONTACT_STATISTICS | — | 1 | — | — | — | — | — | — |
| None | — | 0 | — | — | — | — | — | — |
| CONTACT_ENERGY | — | — | 1 | — | — | — | — | — |
| None | — | — | 0 | — | — | — | — | — |
| CONTACT_ON_DURATION | — | — | — | 1 | — | — | — | — |
| None | — | — | — | 0 | — | — | — | — |
| CONTACT_POWER | — | — | — | — | 1 | — | — | — |
| None | — | — | — | — | 0 | — | — | — |

TABLE 43-continued

| Contact Register | BIT NUMBER | | | | | | | |
|---|---|---|---|---|---|---|---|---|
| FUNCTION | 7 | 6 | 5 | 4 | 3 | 2 | 1 | 0 |
| CONTACT_FREQUENCY | — | — | — | — | — | 1 | — | — |
| None | — | — | — | — | — | 0 | — | — |
| CONTACT_VOLTAGE | — | — | — | — | — | — | 1 | — |
| None | — | — | — | — | — | — | 0 | — |
| CONTACT_CURRENT | — | — | — | — | — | — | — | 1 |
| None | — | — | — | — | — | — | — | 0 |

In some aspects, a contact cycle register (illustrated in TABLE 44) may be configured to contain a one or more-byte value. In some aspects, the following Read and Write commands may be used in connection with the contact cycle register: Read @ 0x8B, and Write @ 0x4B.

TABLE 44

| Contact Cycle Register | BIT NUMBER | | | | | | | |
|---|---|---|---|---|---|---|---|---|
| FUNCTION | 7 | 6 | 5 | 4 | 3 | 2 | 1 | 0 |
| CONTACT_CYCLE_MSTORY | 1 | — | — | — | — | — | — | — |
| None | 0 | — | — | — | — | — | — | — |
| CONTACT_CYCLE_STATISTICS | — | 1 | — | — | — | — | — | — |
| None | — | 0 | — | — | — | — | — | — |
| CONTACT_CYCLE_DUTY_CYCLE | — | — | 1 | — | — | — | — | — |
| None | — | — | 0 | — | — | — | — | — |
| CONTACT_CYCLE_ON_DURATION | — | — | — | 1 | — | — | — | — |
| None | — | — | — | 0 | — | — | — | — |
| CONTACT CYCLE_OFF_DURATION | — | — | — | — | 1 | — | — | — |
| None | — | — | — | — | 0 | — | — | — |
| CONTACT_CYCLE_FREQUENCY | — | — | — | — | — | 1 | — | — |
| None | — | — | — | — | — | 0 | — | — |
| CONTACT_CYCLE_TIME | — | — | — | — | — | — | 1 | — |
| None | — | — | — | — | — | — | 0 | — |
| CONTACT_CYCLE_COUNT | — | — | — | — | — | — | — | 1 |
| None | — | — | — | — | — | — | — | 0 |

In some aspects, a contact stick register (illustrated in TABLE 45) may be configured to contain a one or more-byte value. In some aspects, the following Read and Write commands may be used in connection with the contact stick register: Read @ 0x8C, and Write @ 0x4C.

TABLE 45

| Contact Stick Register | BIT NUMBER | | | | | | | |
|---|---|---|---|---|---|---|---|---|
| FUNCTION | 7 | 6 | 5 | 4 | 3 | 2 | 1 | 0 |
| CONTACT_STICK_HISTORY | 1 | — | — | — | — | — | — | — |
| None | 0 | — | — | — | — | — | — | — |
| CONTACT_STICK_STATISTICS | — | 1 | — | — | — | — | — | — |
| None | — | 0 | — | — | — | — | — | — |
| CONTACT_STICK_REFERENCE_WOO | — | — | 0 | — | — | — | — | — |
| None | — | — | 1 | — | — | — | — | — |
| CONTACT_STICK_WINDOW | — | — | — | 1 | — | — | — | — |
| None | — | — | — | 0 | — | — | — | — |
| CONTACT_STICK_MIRATION_CREST_FACTOR | — | — | — | — | 1 | — | — | — |
| None | — | — | — | — | 0 | — | — | — |
| CONTACT_PEAK_STICK_DURATION | — | — | — | — | — | 1 | — | — |
| None | — | — | — | — | — | 0 | — | — |
| CONTACT_ AVERAGE_STICK_DURATION | — | — | — | — | — | — | 1 | — |
| None | — | — | — | — | — | — | 0 | — |
| CONTACT_STICK_DURATION | — | — | — | — | — | — | — | 1 |
| None | — | — | — | — | — | — | — | 0 |

In some aspects, a contact health register (illustrated in TABLE 46) may be configured to contain a one or more-byte value. In some aspects, the following Read and Write commands may be used in connection with the contact health register: Read @ 0x8D, and Write @ 0x4D.

TABLE 46

| Contact Health Register | BIT NUMBER | | | | | | | |
|---|---|---|---|---|---|---|---|---|
| FUNCTION | 1 | 6 | 5 | 4 | 3 | 2 | 1 | 0 |
| CONTACT_HEALTH _HISTORY | 1 | — | — | — | — | — | — | — |
| None | 0 | — | — | — | — | — | — | — |
| CONTACT_HEALTH_STATISTICS | — | 1 | — | — | — | — | — | — |
| None | — | 0 | — | — | — | — | — | — |
| CONTACT_HEALTH_FAILURE | — | — | 1 | — | — | — | — | — |
| None | — | — | 0 | — | — | — | — | — |
| CONTACT_HEALTH_REPLACE | — | — | — | 1 | — | — | — | — |
| None | — | — | — | 0 | — | — | — | — |
| CONTACT_HEALTH_POOR | — | — | — | — | 1 | — | — | — |
| None | — | — | — | — | 0 | — | — | — |
| CONTACT_HEALTH_AVERAGE | — | — | — | — | — | 1 | — | — |
| None | — | — | — | — | — | 0 | — | — |

TABLE 46-continued

| Contact Health Register | BIT NUMBER | | | | | | | |
|---|---|---|---|---|---|---|---|---|
| FUNCTION | 7 | 6 | 5 | 4 | 3 | 2 | 1 | 0 |
| CONTACT_HEALTH_GOOD | — | — | — | — | — | — | 1 | — |
| None | — | — | — | — | — | — | 0 | — |
| CONTACT_STICK_NEW | — | — | — | — | — | — | — | 1 |
| None | — | — | — | — | — | — | — | 0 |

In some aspects, a contact health assessment register (illustrated in TABLE 47) may be configured to contain a one or more-byte value. In some aspects, the following Read and Write commands may be used in connection with the contact health assessment register: Read @ 0x8E, and Write @ 0x4E.

TABLE 47

| Contact Health Assessment Register | BIT NUMBER | | | | | | | |
|---|---|---|---|---|---|---|---|---|
| VALUE | 7 | 6 | 5 | 4 | 3 | 2 | 1 | 0 |
| Maximum: 100% healthy | 1 | 1 | 1 | 1 | 1 | 1 | 1 | 1 |
| Default: none | x | x | x | x | x | x | x | x |
| Minimum: 0% healthy | 0 | 0 | 0 | 0 | 0 | 0 | 0 | 0 |

In some aspects, a contact fault register (illustrated in TABLE 48) may be configured to contain a one or more-byte value. In some aspects, the following Read and Write commands may be used in connection with the contact fault register: Read @ 0x8F. and Write @ 0x4F.

TABLE 48

| Contact Fault Register | BIT NUMBER | | | | | | | |
|---|---|---|---|---|---|---|---|---|
| FUNCTION | 7 | 6 | 5 | 4 | 3 | 2 | 1 | 0 |
| CONTACT_FAULT_HISTORY | 1 | — | — | — | — | — | — | — |
| None | 0 | — | — | — | — | — | — | — |
| CONTACT_FAULT_STATISTICS | — | 1 | — | — | — | — | — | — |
| None | — | 0 | — | — | — | — | — | — |
| CONTACT_FAULT_ALARM | — | — | 1 | — | — | — | — | — |
| None | — | — | 0 | — | — | — | — | — |
| CONTACT_FAULT_CLEARING | — | — | — | 1 | — | — | — | — |
| None | — | — | — | 0 | — | — | — | — |
| CONTACT_FAULT_FLASH_CODE | — | — | — | — | 1 | — | — | — |
| None | — | — | — | — | 0 | — | — | — |
| CONTACT_FAULT_CODE | — | — | — | — | — | 1 | — | — |
| None | — | — | — | — | — | 0 | — | — |
| CONTACT_FAULT_ALERT | — | — | — | — | — | — | 1 | — |
| None | — | — | — | — | — | — | 0 | — |
| CONTACT_FAULT_DEFECTION | — | — | — | — | — | — | — | 1 |
| None | — | — | — | — | — | — | — | 0 |

In some aspects, a contact failure register (illustrated in TABLE 49) may be configured to contain a one or more-byte value. In some aspects, the following Read and Write commands may be used in connection with the contact failure register: Read @ 0x90, and Write @ 0x50.

TABLE 49

| Contact Failure Register | BIT NUMBER | | | | | | | |
|---|---|---|---|---|---|---|---|---|
| FUNCTION | 7 | 6 | 5 | 4 | 3 | 2 | 1 | 0 |
| CONTACT_FAILURE_HISTORY | 1 | — | — | — | — | — | — | — |
| None | 0 | — | — | — | — | — | — | — |
| CONTACT_FAILURE_STATISTICS | — | 1 | — | — | — | — | — | — |
| None | — | 0 | — | — | — | — | — | — |
| CONTACT_FAILURE_ALARM | — | — | 1 | — | — | — | — | — |
| None | — | — | 0 | — | — | — | — | — |
| CONTACT_FAILURE_CLEARING | — | — | — | 1 | — | — | — | — |
| None | — | — | — | 0 | — | — | — | — |
| CONTACT_FAILURE_FLASH_CODE | — | — | — | — | 1 | — | — | — |
| None | — | — | — | — | 0 | — | — | — |
| CONTACT_FAILURE_CODE | — | — | — | — | — | 1 | — | — |
| None | — | — | — | — | — | 0 | — | — |
| CONTACT_FAILURE_ALERT | — | — | — | — | — | — | 1 | — |
| None | — | — | — | — | — | — | 0 | — |
| CONTACT_FAILURE_DETECTION | — | — | — | — | — | — | — | 1 |
| None | — | — | — | — | — | — | — | 0 |

In some aspects, a make bounce arc register (illustrated in TABLE 50) may be configured to contain a one or more-byte value. In some aspects, the following Read and Write commands may be used in connection with the make bounce arc register: Read @ 0x91, and Write @ 0x51.

TABLE 50

| Make Bounce Arc Register | BIT NUMBER | | | | | | | |
|---|---|---|---|---|---|---|---|---|
| FUNCTION | 7 | 6 | 5 | 4 | 3 | 2 | 1 | 0 |
| MAKE_BOUNCE_ARC_ENERGY | 1 | — | — | — | — | — | — | — |
| None | 0 | — | — | — | — | — | — | — |
| MAKE_BOUNCE_ARC_DURATION | — | 1 | — | — | — | — | — | — |
| None | — | 0 | — | — | — | — | — | — |
| MAKE_BOUNCE_ARC_POWER | — | — | 1 | — | — | — | — | — |
| None | — | — | 0 | — | — | — | — | — |
| MAKE_BOUNCE_ARC_BOUNCES | — | — | — | 1 | — | — | — | — |
| None | — | — | — | 0 | — | — | — | — |
| MAKE_BOUNCE_ARC_FREQUENCY | — | — | — | — | 1 | — | — | — |
| None | — | — | — | — | 0 | — | — | — |
| MAKE_BOUNCE_ARC_RESISTANCE | — | — | — | — | — | 1 | — | — |
| None | — | — | — | — | — | 0 | — | — |
| MAKE_BOUNCE_ARC_CURRENT | — | — | — | — | — | — | 1 | — |
| None | — | — | — | — | — | — | 0 | — |
| MAKE_BOUNCE_ARC_VOLTAGE | — | — | — | — | — | — | — | 1 |
| None | — | — | — | — | — | — | — | 0 |

In some aspects, a break bounce arc register (illustrated in TABLE 51) may be configured to contain a one or more-byte value. In some aspects, the following Read and Write commands may be used in connection with the break bounce arc register: Read @ 0x92, and Write @ 0x52.

TABLE 51

| Break Bounce Arc Register | | | | BIT NUMBER | | | | |
|---|---|---|---|---|---|---|---|---|
| FUNCTION | 7 | 6 | 5 | 4 | 3 | 2 | 1 | 0 |
| BREAK_BOUNCE_ARC_ENERGY | 1 | — | — | — | — | — | — | — |
| None | 0 | — | — | — | — | — | — | — |
| BREAK_BOUNCE_ARC_DURATION | — | 1 | — | — | — | — | — | — |
| None | — | 0 | — | — | — | — | — | — |
| BREAK_BOUNCE_ARC_POWER | — | — | 1 | — | — | — | — | — |
| None | — | — | 0 | — | — | — | — | — |
| BREAK_BOUNCE_ARC_BOUNCES | — | — | — | 1 | — | — | — | — |
| None | — | — | — | 0 | — | — | — | — |
| BREAK_BOUNCE_ARC_FREQUENCY | — | — | — | — | 1 | — | — | — |
| None | — | — | — | — | 0 | — | — | — |
| BREAK_BOUNCE_ARC_RESISTANCE | — | — | — | — | — | 1 | — | — |
| None | — | — | — | — | — | 0 | — | — |
| BREAK_BOUNCE_ARC_CURRENT | — | — | — | — | — | — | 1 | — |
| None | — | — | — | — | — | — | 0 | — |
| BREAK_BOUNCE_ARC_VOLTAGE | — | — | — | — | — | — | — | 1 |
| None | — | — | — | — | — | — | — | 0 |

In some aspects, a cycle count register (illustrated in TABLE 52) may be configured to contain a one or more-byte value. In some aspects, the following Read and Write commands may be used in connection with the cycle count register: Read @ 0x93, and Write @ 0x53.

TABLE 52

| Cycle Count Register | | | | BIT NUMBER | | | | |
|---|---|---|---|---|---|---|---|---|
| FUNCTION | 7 | 6 | 5 | 4 | 3 | 2 | 1 | 0 |
|  | 1 | — | — | — | — | — | — | — |
| None | 0 | — | — | — | — | — | — | — |
|  | — | 1 | — | — | — | — | — | — |
| None | — | 0 | — | — | — | — | — | — |
|  | — | — | 1 | — | — | — | — | — |
| None | — | — | 0 | — | — | — | — | — |
|  | — | — | — | 1 | — | — | — | — |
| None | — | — | — | 0 | — | — | — | — |
|  | — | — | — | — | 1 | — | — | — |
| None | — | — | — | — | 0 | — | — | — |
|  | — | — | — | — | — | 1 | — | — |
| None | — | — | — | — | — | 0 | — | — |
|  | — | — | — | — | — | — | 1 | — |
| None | — | — | — | — | — | — | 0 | — |
|  | — | — | — | — | — | — | — | 1 |
| None | — | — | — | — | — | — | — | 0 |

In some aspects, a sliding window register (illustrated in TABLE 53) may be configured to contain a one or more-byte value. In some aspects, the following Read and Write commands may be used in connection with the sliding window register: Read @ 0x94, and Write @ 0x54.

TABLE 53

| Sliding Window Register | | | | BIT NUMBER | | | | |
|---|---|---|---|---|---|---|---|---|
| FUNCTION | 7 | 6 | 5 | 4 | 3 | 2 | 1 | 0 |
| CONSECUTIVE_WINDOW_SIZE | 1 | — | — | — | — | — | — | — |
| None | 0 | — | — | — | — | — | — | — |
| CONSECUTIVE_WINDOW | — | 1 | — | — | — | — | — | — |
| None | — | 0 | — | — | — | — | — | — |
| CONTINUOUS_WINDOW_SIZE | — | — | 1 | — | — | — | — | — |
| None | — | — | 0 | — | — | — | — | — |
| CONTINUOUS_WINDOW | — | — | — | 1 | — | — | — | — |

TABLE 53-continued

| Sliding Window Register | | | | BIT NUMBER | | | | |
|---|---|---|---|---|---|---|---|---|
| FUNCTION | 7 | 6 | 5 | 4 | 3 | 2 | 1 | 0 |
| None | — | — | — | 0 | — | — | — | — |
|  | — | — | — | — | 1 | — | — | — |
| None | — | — | — | — | 0 | — | — | — |
|  | — | — | — | — | — | 1 | — | — |
| None | — | — | — | — | — | 0 | — | — |
|  | — | — | — | — | — | — | 1 | — |
| None | — | — | — | — | — | — | 0 | — |
|  | — | — | — | — | — | — | — | 1 |
| None | — | — | — | — | — | — | — | 0 |

In some aspects, a first window register (illustrated in TABLE 54) may be configured to contain a one or more-byte value. In some aspects, the following Read and Write commands may be used in connection with the first window register: Read @ 0x95, and Write @ 0x55.

TABLE 54

| First Window Register | | | | BIT NUMBER | | | | |
|---|---|---|---|---|---|---|---|---|
| FUNCTION | 7 | 6 | 5 | 4 | 3 | 2 | 1 | 0 |
| MAX | 1 | — | — | — | — | — | — | — |
| None | 0 | — | — | — | — | — | — | — |
| AVG | — | 1 | — | — | — | — | — | — |
| None | — | 0 | — | — | — | — | — | — |
| MIN | — | — | 1 | — | — | — | — | — |
| None | — | — | 0 | — | — | — | — | — |
| RMS | — | — | — | 1 | — | — | — | — |
| None | — | — | — | 0 | — | — | — | — |
| MEAN | — | — | — | — | 1 | — | — | — |
| None | — | — | — | — | 0 | — | — | — |
| MED | — | — | — | — | — | 1 | — | — |
| None | — | — | — | — | — | 0 | — | — |
| STD_DEV | — | — | — | — | — | — | 1 | — |
| None | — | — | — | — | — | — | 0 | — |
|  | — | — | — | — | — | — | — | 1 |
| None | — | — | — | — | — | — | — | 0 |

In some aspects, a second window register (illustrated in TABLE 55) may be configured to contain a one or more-byte value. In some aspects, the following Read and Write commands may be used in connection with the second window register: Read @ 0x96, and Write @ 0x56.

TABLE 55

| Second Window Register | | | | BIT NUMBER | | | | |
|---|---|---|---|---|---|---|---|---|
| FUNCTION | 7 | 6 | 5 | 4 | 3 | 2 | 1 | 0 |
| MAX | 1 | — | — | — | — | — | — | — |
| None | 0 | — | — | — | — | — | — | — |
| AVG | — | 1 | — | — | — | — | — | — |
| None | — | 0 | — | — | — | — | — | — |
| MIN | — | — | 1 | — | — | — | — | — |
| None | — | — | 0 | — | — | — | — | — |
| RMS | — | — | — | 1 | — | — | — | — |
| None | — | — | — | 0 | — | — | — | — |
| MEAN | — | — | — | — | 1 | — | — | — |
| None | — | — | — | — | 0 | — | — | — |
| MED | — | — | — | — | — | 1 | — | — |
| None | — | — | — | — | — | 0 | — | — |
| STD_DEV | — | — | — | — | — | — | 1 | — |
| None | — | — | — | — | — | — | 0 | — |
|  | — | — | — | — | — | — | — | 1 |
| None | — | — | — | — | — | — | — | 0 |

In some aspects, a third window register (illustrated in TABLE 56) may be configured to contain a one or more-byte value. In some aspects, the following Read and Write commands may be used in connection with the second window register: Read @ 0x97, and Write @ 0x57.

TABLE 56

| Third Window Register | BIT NUMBER | | | | | | | |
|---|---|---|---|---|---|---|---|---|
| FUNCTION | 7 | 6 | 5 | 4 | 3 | 2 | 1 | 0 |
| MAX | 1 | — | — | — | — | — | — | — |
| None | 0 | — | — | — | — | — | — | — |
| AVG | — | 1 | — | — | — | — | — | — |
| None | — | 0 | — | — | — | — | — | — |
| MIN | — | — | 1 | — | — | — | — | — |
| None | — | — | 0 | — | — | — | — | — |
| RMS | — | — | — | 1 | — | — | — | — |
| None | — | — | — | 0 | — | — | — | — |
| MEAN | — | — | — | — | 1 | — | — | — |
| None | — | — | — | — | 0 | — | — | — |
| MED | — | — | — | — | — | 1 | — | — |
| None | — | — | — | — | — | 0 | — | — |
| STD_DEV | — | — | — | — | — | — | 1 | — |
| None | — | — | — | — | — | — | 0 | — |
|  | — | — | — | — | — | — | — | 1 |
| None | — | — | — | — | — | — | — | 0 |

In some aspects, a fourth window register (illustrated in TABLE 57) may be configured to contain a one or more-byte value. In some aspects, the following Read and Write commands may be used in connection with the second window register: Read @ 0x98, and Write @ 0x58.

TABLE 57

| Fourth Window Register | BIT NUMBER | | | | | | | |
|---|---|---|---|---|---|---|---|---|
| FUNCTION | 7 | 6 | 5 | 4 | 3 | 2 | 1 | 0 |
| MAX | 1 | — | — | — | — | — | — | — |
| None | 0 | — | — | — | — | — | — | — |
| AVG | — | 1 | — | — | — | — | — | — |
| None | — | 0 | — | — | — | — | — | — |
| MIN | — | — | 1 | — | — | — | — | — |
| None | — | — | 0 | — | — | — | — | — |
| RMS | — | — | — | 1 | — | — | — | — |
| None | — | — | — | 0 | — | — | — | — |
| MEAN | — | — | — | — | 1 | — | — | — |
| None | — | — | — | — | 0 | — | — | — |
| MED | — | — | — | — | — | 1 | — | — |
| None | — | — | — | — | — | 0 | — | — |
| STD_DEV | — | — | — | — | — | — | 1 | — |
| None | — | — | — | — | — | — | 0 | — |
|  | — | — | — | — | — | — | — | 1 |
| None | — | — | — | — | — | — | — | 0 |

In some aspects, a stick duration register (illustrated in TABLE 58) may be configured to contain a one or more-byte value. In some aspects, the stick duration may be the measured time difference between the coil de-activation (for a normally open, Form A type relay contact) signal to break the power contact and the actual instance of power contact separation detection.

In some aspects, the following Read and Write commands may be used in connection with the stick duration register: Read @ 0x99, and Write @ 0x59.

TABLE 58

| Stick Duration Register | BIT NUMBER | | | | | | | |
|---|---|---|---|---|---|---|---|---|
| FUNCTION | 7 | 6 | 5 | 4 | 3 | 2 | 1 | 0 |
| MAXIMUM_STICK_DURATION | 1 | — | — | — | — | — | — | — |
| None | 0 | — | — | — | — | — | — | — |

TABLE 58-continued

| Stick Duration Register | BIT NUMBER | | | | | | | |
|---|---|---|---|---|---|---|---|---|
| FUNCTION | 7 | 6 | 5 | 4 | 3 | 2 | 1 | 0 |
| AVERAGE_STICK_DURATION | — | 1 | — | — | — | — | — | — |
| None | — | 0 | — | — | — | — | — | — |
| MINIMUM_STICK_DURATION | — | — | 1 | — | — | — | — | — |
| None | — | — | 0 | — | — | — | — | — |
|  | — | — | — | 1 | — | — | — | — |
| None | — | — | — | 0 | — | — | — | — |
|  | — | — | — | — | 1 | — | — | — |
| None | — | — | — | — | 0 | — | — | — |
|  | — | — | — | — | — | 1 | — | — |
| None | — | — | — | — | — | 0 | — | — |
|  | — | — | — | — | — | — | 1 | — |
| None | — | — | — | — | — | — | 0 | — |
|  | — | — | — | — | — | — | — | 1 |
| None | — | — | — | — | — | — | — | 0 |

In some aspects, a stick duration speed register (illustrated in TABLE 59) may be configured to contain a one or more-byte value. In some aspects, the stick duration speed is the calculated difference between two sets of sliding window stick duration instances or windows.

In some aspects, the following Read and Write commands may be used in connection with the stick duration speed register: Read @ 0x9 A, and Write @0x5 A.

TABLE 59

| Stick Duration Speed Register | BIT NUMBER | | | | | | | |
|---|---|---|---|---|---|---|---|---|
| FUNCTION | 7 | 6 | 5 | 4 | 3 | 2 | 1 | 0 |
|  | 1 | — | — | — | — | — | — | — |
| None | 0 | — | — | — | — | — | — | — |
|  | — | 1 | — | — | — | — | — | — |
| None | — | 0 | — | — | — | — | — | — |
|  | — | — | 1 | — | — | — | — | — |
| None | — | — | 0 | — | — | — | — | — |
|  | — | — | — | 1 | — | — | — | — |
| None | — | — | — | 0 | — | — | — | — |
|  | — | — | — | — | 1 | — | — | — |
| None | — | — | — | — | 0 | — | — | — |
|  | — | — | — | — | — | 1 | — | — |
| None | — | — | — | — | — | 0 | — | — |
|  | — | — | — | — | — | — | 1 | — |
| None | — | — | — | — | — | — | 0 | — |
|  | — | — | — | — | — | — | — | 1 |
| None | — | — | — | — | — | — | — | 0 |

In some aspects, a stick duration acceleration register (illustrated in TABLE 60) may be configured to contain a one or more-byte value. In some aspects, the stick duration acceleration is the calculated difference between two sets of sliding window stick speed instances or windows.

In some aspects, the following Read and Write commands may be used in connection with the stick duration acceleration register: Read @ 0x9B, and Write @ 0x5B.

TABLE 60

| Stick Duration Acceleration Register FUNCTION | BIT NUMBER | | | | | | | |
|---|---|---|---|---|---|---|---|---|
| | 7 | 6 | 5 | 4 | 3 | 2 | 1 | 0 |
| None | 1 | — | — | — | — | — | — | — |
| None | 0 | — | — | — | — | — | — | — |
| None | — | 1 | — | — | — | — | — | — |
| None | — | 0 | — | — | — | — | — | — |
| None | — | — | 1 | — | — | — | — | — |
| None | — | — | 0 | — | — | — | — | — |
| None | — | — | — | 1 | — | — | — | — |
| None | — | — | — | 0 | — | — | — | — |
| None | — | — | — | — | 1 | — | — | — |
| None | — | — | — | — | 0 | — | — | — |
| None | — | — | — | — | — | 1 | — | — |
| None | — | — | — | — | — | 0 | — | — |
| None | — | — | — | — | — | — | 1 | — |
| None | — | — | — | — | — | — | — | 0 |
| None | — | — | — | — | — | — | — | 1 |
| None | — | — | — | — | — | — | — | 0 |

In some aspects, a stick duration acceleration speed register (illustrated in TABLE 61) may be configured to contain a one or more-byte value. In some aspects, the stick duration acceleration speed is the calculated difference between two sets of sliding window stick acceleration instances or windows.

In some aspects, the following Read and Write commands may be used in connection with the stick duration acceleration speed register: Read @ 0x9C. and Write @ 0x5C.

TABLE 61

| Stick Duration Acceleration Register FUNCTION | BIT NUMBER | | | | | | | |
|---|---|---|---|---|---|---|---|---|
| | 7 | 6 | 5 | 4 | 3 | 2 | 1 | 0 |
| MAX_STICK_DURATION_ACCELERATION_SPEED | 1 | — | — | — | — | — | — | — |
| None | 0 | — | — | — | — | — | — | — |
| AVG_STICK_DURATION_ACCELERATION_SPEED | — | 1 | — | — | — | — | — | — |
| None | — | 0 | — | — | — | — | — | — |
| MIN_STICK_DURATION_ACCELERATION_SPEED | — | — | 1 | — | — | — | — | — |
| None | — | — | 0 | — | — | — | — | — |
| None | — | — | — | 1 | — | — | — | — |
| None | — | — | — | 0 | — | — | — | — |
| None | — | — | — | — | 1 | — | — | — |
| None | — | — | — | — | 0 | — | — | — |
| None | — | — | — | — | — | 1 | — | — |
| None | — | — | — | — | — | 0 | — | — |
| None | — | — | — | — | — | — | 1 | — |
| None | — | — | — | — | — | — | 0 | — |
| None | — | — | — | — | — | — | — | 1 |
| None | — | — | — | — | — | — | — | 0 |

In some aspects, a prediction limit register (illustrated in TABLE 62) may be configured to contain a one or more-byte value. The prediction limit register contains values entered for specific parameters.

In some aspects, the following Read and Write commands may be used in connection with the prediction limit register: Read @ 0x9D, and Write @ 0x5D.

TABLE 62

| Prediction Limit Register FUNCTION | BIT NUMBER | | | | | | | |
|---|---|---|---|---|---|---|---|---|
| | 7 | 6 | 5 | 4 | 3 | 2 | 1 | 0 |
| MAX_CYCLE_COUNT_LIMIT | 1 | — | — | — | — | — | — | — |
| None | 0 | — | — | — | — | — | — | — |
| MAX_PEAK_STICK_DURATION_LIMIT | — | 1 | — | — | — | — | — | — |
| None | — | 0 | — | — | — | — | — | — |
| MAX_STICK_DURATION_CREST_FACTOR_LIMIT | — | — | 1 | — | — | — | — | — |
| None | — | — | 0 | — | — | — | — | — |
| MECHANICAL_LIFETIME_LIMIT | — | — | — | 1 | — | — | — | — |
| None | — | — | — | 0 | — | — | — | — |
| None | — | — | — | — | 1 | — | — | — |
| None | — | — | — | — | 0 | — | — | — |
| None | — | — | — | — | — | 1 | — | — |
| None | — | — | — | — | — | 0 | — | — |
| None | — | — | — | — | — | — | 1 | — |
| None | — | — | — | — | — | — | 0 | — |
| None | — | — | — | — | — | — | — | 1 |
| None | — | — | — | — | — | — | — | 0 |

In some aspects, an end-of-life prediction register (illustrated in TABLE 63) may be configured as a four (4) byte register. The end-of-life prediction is the calculated number of cycles left from the recorded present cycle count to the selected limit count in the prediction limit register.

In some aspects, the following Read and Write commands may be used in connection with the prediction limit register: Read @ 0x9E. and Write @ 0x5E.

TABLE 63

| end-of-life Prediction Register | BIT NUMBER | | | | | | | |
|---|---|---|---|---|---|---|---|---|
| FUNCTION | 7 | 6 | 5 | 4 | 3 | 2 | 1 | 0 |
| WINDOW_COUNT | 1 | — | — | — | — | — | — | — |
| None | 0 | — | — | — | — | — | — | — |
| CONTACT_CYCLE_COUNT | — | 1 | — | — | — | — | — | — |
| None | — | 0 | — | — | — | — | — | — |
| STICK_DURATION | — | — | 1 | — | — | — | — | — |
| None | — | — | 0 | — | — | — | — | — |
| STICK_DURATION_GROWTH | — | — | — | 1 | — | — | — | — |
| None | — | — | — | 0 | — | — | — | — |
| STICK_DURATION_GROWTH_SPEED | — | — | — | — | 1 | — | — | — |
| None | — | — | — | — | 0 | — | — | — |
| STICK_DURATION_GROWTH_ACCELERATION | — | — | — | — | — | 1 | — | — |
| None | — | — | — | — | — | 0 | — | — |
| CONTACT_FAILURE_LIMIT | — | — | — | — | — | — | 1 | — |
| None | — | — | — | — | — | — | 0 | — |
| CONTACT_CYCLES_TO_END_OF_LIFE | — | — | — | — | — | — | — | 1 |
| None | — | — | — | — | — | — | — | 0 |

Figure 3:
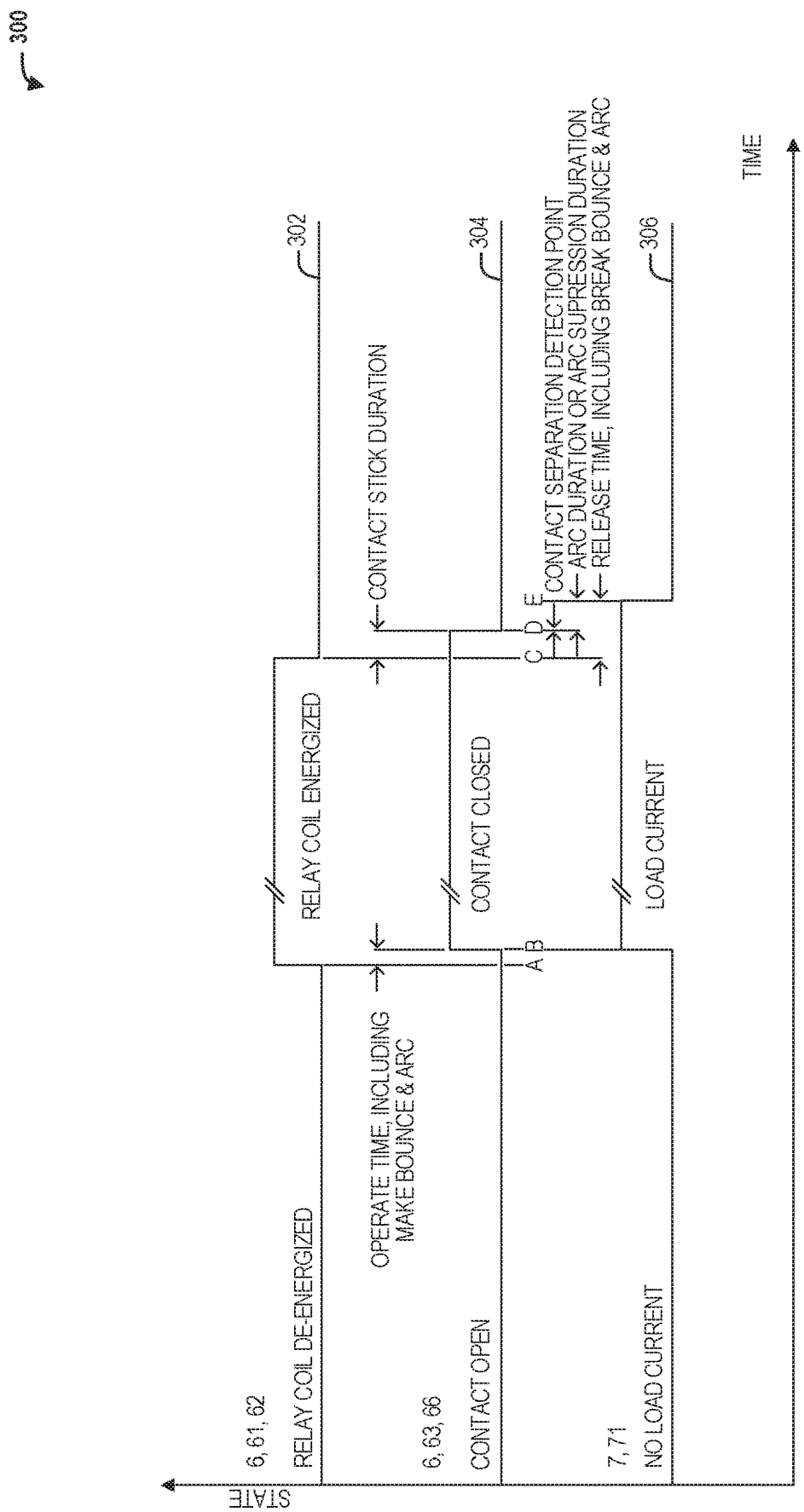
FIG. 3 depicts a timing diagram for defining contact stick duration using the example power contact EoL predictor of FIG. 2, according to some embodiments.

FIG. 3 depicts a timing diagram 300 for defining contact stick duration using the example power contact EoL predictor of FIG. 2, according to some embodiments. As illustrated in FIG. 3, the horizontal coordinate axis is graduated in time, and the vertical coordinate axis is graduated in relay states.

The first graph 302 illustrates the relay coil state. The relay coil of the wet relay 6 de-energized condition is represented by the low state. The relay coil energized condition is represented by the high state.

Point A on the graph is signified by the low to high transition of the relay coil state. Point C on the graph is signified by the high to low transition of the relay coil state.

The second graph 304 illustrates the wet relay 6 contact state. The relay contact open condition is represented by the low state. The relay contact closed condition is represented by the high state.

Point B on the graph is signified by the low to high transition of the relay contact state. Point D on the graph is signified by the high to low transition of the relay contact state. Point D is also the contact separation detection point.

The third graph 306 illustrates the relay contact load current. The relay contact no load current is represented by the low state. The relay contact load current is represented by the high state.

Point B on the graph is signified by the low to high transition of the load current state. Point E on the graph is signified by the high to low transition of the load current state.

The time difference between points A and B is what the relay industry refers to as the relay operate time, including make bounce and arc. The time difference between point C and D is the relay contact stick duration. The time difference between point C and E is what the relay industry refers to as the relay release time, including break bounce and arc. The time difference between point D and E is either the arc or arc suppression duration.

Figure 4:
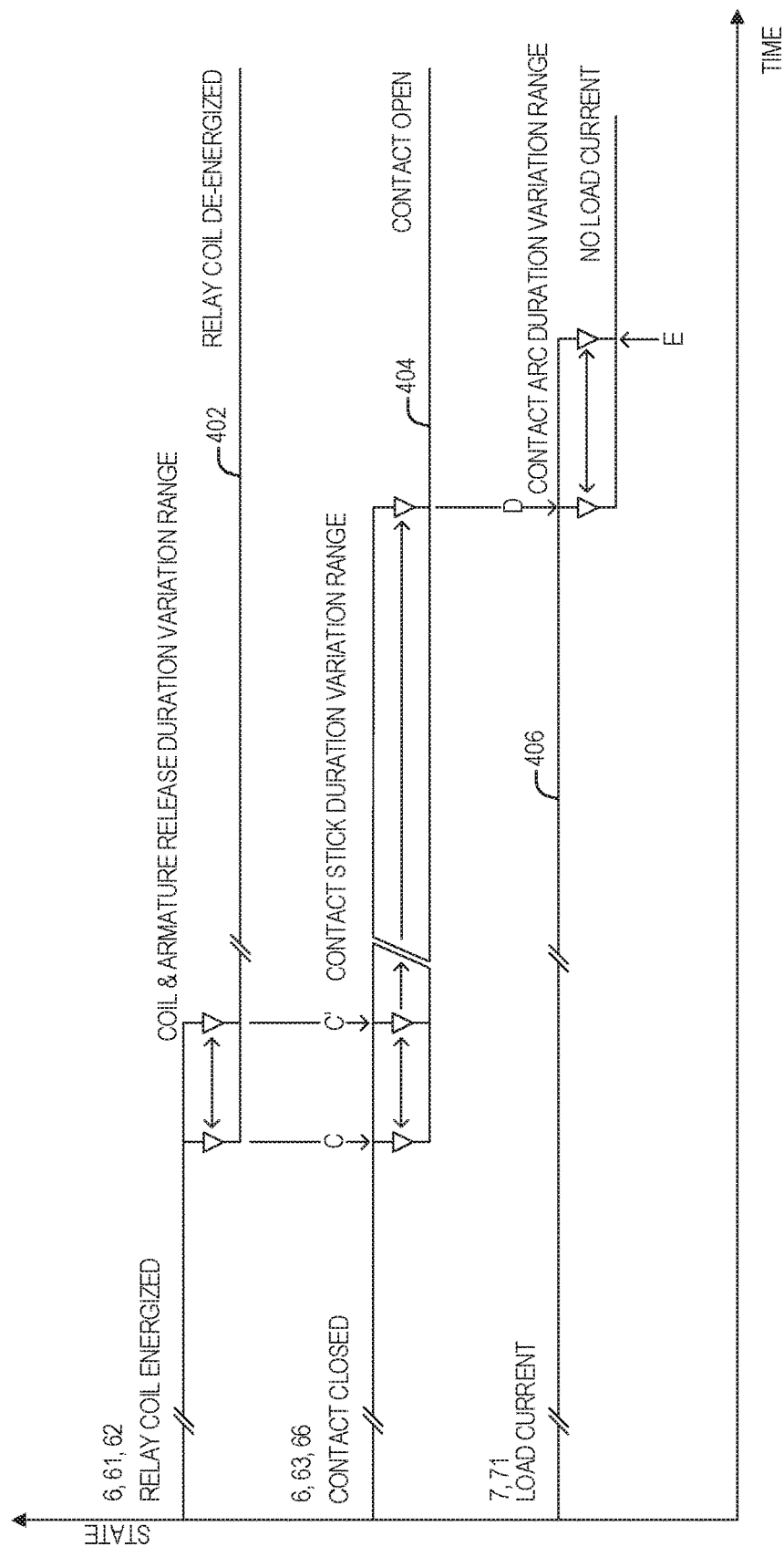
FIG. 4 depicts a timing diagram with a contact stick duration variation range, according to some embodiments.

FIG. 4 depicts a timing diagram 400 with a contact stick duration variation range, according to some embodiments.

As illustrated in FIG. 4, the horizontal coordinate axis is graduated in time, and the vertical coordinate axis is graduated in relay states.

The first graph 402 illustrates the relay coil state. The relay coil de-energized condition is represented by the low state. The relay coil energized condition is represented by the high state. A coil and armature release duration variation is shown to vary between points C and C'.

The second graph 404 illustrates the relay contact state. The relay contact open condition is represented by the low state. The relay contact closed condition is represented by the high state. A contact stick duration variation is shown to vary between points C and D.

The third graph 406 illustrates the relay contact load current. The relay contact no load current is represented by the low state. The relay contact load current is represented by the high state. A contact arc duration variation range is shown to vary between points D and E.

Figure 5:
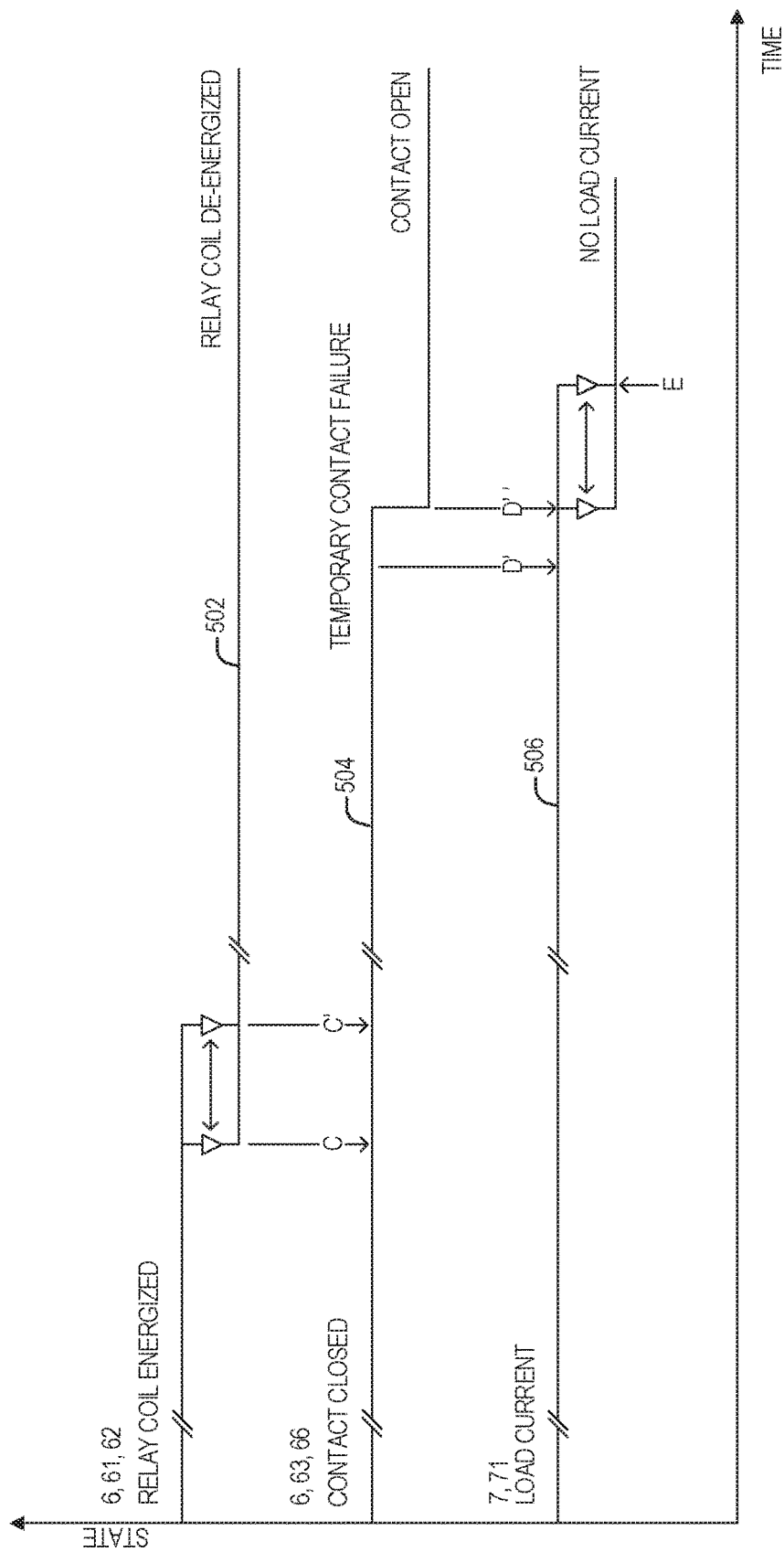
FIG. 5 depicts a timing diagram for a power contact with a temporary failure, according to some embodiments.

FIG. 5 depicts a timing diagram 500 for a power contact with a temporary failure, according to some embodiments.

The first graph 502 illustrates the relay coil voltage status. The second graph 504 illustrates the contact closure voltage status including a temporary contact failure between points D' and D". The third graph 506 illustrates the load current status.

Figure 6:
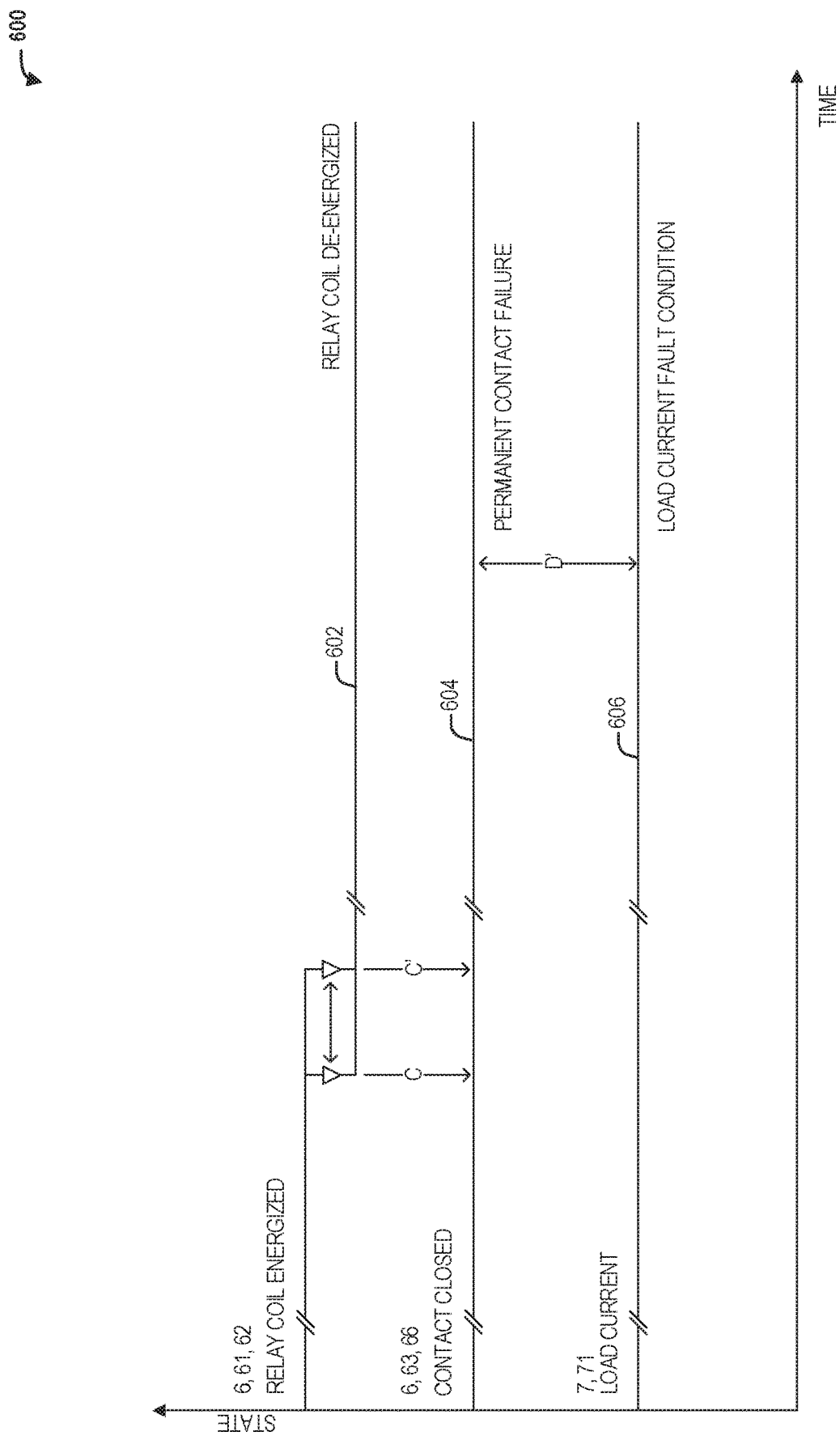
FIG. 6 depicts a timing diagram for a power contact with permanent failure, according to some embodiments.

FIG. 6 depicts a timing diagram 600 for a power contact with permanent failure, according to some embodiments. The first graph 602 illustrates the relay coil voltage status. The second graph 604 illustrates the contact closure voltage status including a permanent contact failure at point D'. The third graph 606 illustrates the load current status including a load current fault condition at point D'.

FIG. 7 depicts a graph 700 of contact stick duration measurements during multiple sampling windows (or stick duration intervals) for performing EoL prediction by the EoL predictor of FIG. 2, according to some embodiments. Referring to FIG. 7, multiple sampling windows may be configured in sampling window groups. For example, window group 0 includes sampling windows W1. W2, W3, and W4. A pre-determined window size may be used, which may be based on a pre-determined number (e.g., N) of contact cycles taking place within each sampling window. In this regard, N stick duration measurements may be performed within each sampling window.

The graph illustrates the plotted values of the stick durations within each stick duration sampling window (also referred to as a stick duration interval or SDI). As seen in FIG. 7, the stick duration values increase as the number of contact cycles increases, reaching a maximum value at point F which is associated with an EoL prediction of a failure point (e.g., when the stick duration time is 1 second or greater).

In some aspects, the stick duration measurements for each sampling window in a window group may be stored in separate registers (e.g., 4 registers may be used for the 4 sampling windows within each window group). As new stick duration data is obtained (e.g., after window 4), the oldest window data (e.g., window 1) may be dropped and a new window group may be formed as new window data (e.g., window 4') is obtained, thereby forming new window group 1.

In this regard, EoL predictions can be performed by the EoL predictor 1 using stick durations (or other data based on the stick durations) obtained during one or more sampling windows (e.g., multiple sampling windows forming a window group as illustrated in FIG. 7).

Figure 8:
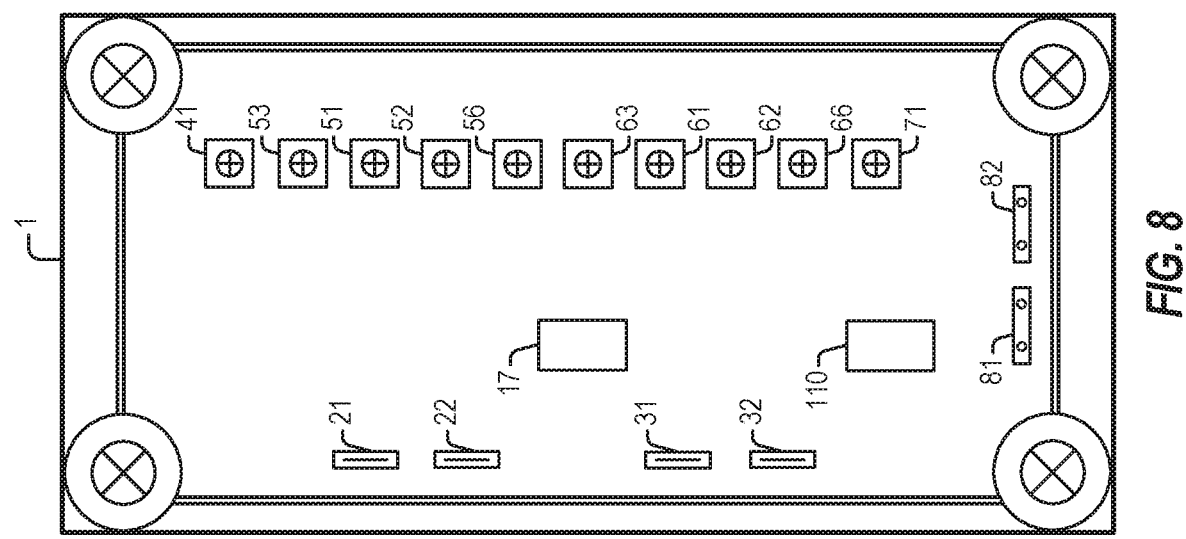
FIG. 8 depicts a packaging example of an EoL predictor, according to some embodiments.

FIG. 8 depicts a packaging example of an EoL predictor, according to some embodiments.

Additional Examples

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

Example 1 is an electrical circuit, comprising: a pair of terminals adapted to be connected to a set of switchable contact electrodes of a power contact; a power switching circuit operatively coupled to the pair of terminals, the power switching circuit configured to switch power from an external power source and to trigger activation of the set of switchable contact electrodes based on a first logic state signal or deactivation of the set of switchable contact electrodes based on a second logic state signal; a contact separation detector operatively coupled to the pair of terminals, the contact separation detector configured to determine a time of separation of the set of switchable contact electrodes of the power contact during the deactivation; and a controller circuit operatively coupled to the pair of terminals, the power switching circuit, and the contact separation detector, the controller circuit configured to: for each contact cycle of a plurality of contact cycles of the power contact within at least one sampling window: generate the second logic state signal to trigger the deactivation of the set of switchable contact electrodes; and determine a stick duration associated with the set of switchable contact electrodes, the stick duration based on a difference between a time the second logic state signal is generated and the time of separation during the contact cycle; and generate an end-of-life (EoL) prediction for the set of switchable contact electrodes of the power contact based on the determined stick duration for each contact cycle of the plurality of contact cycles within the at least one sampling window.

In Example 2, the subject matter of Example 1 includes, wherein the at least one sampling window comprises at least a first sampling window, a second sampling window, and a third sampling window, and wherein the plurality of contact cycles within each of the sampling windows is N contact cycles, N being a power of 2 integer.

In Example 3, the subject matter of Example 2 includes, wherein the controller circuit is configured to store the determined stick durations associated with the plurality of contact cycles during the first sampling window in a shift register.

In Example 4, the subject matter of Example 3 includes, wherein the controller circuit is configured to perform an averaging function to determine an average stick duration for the first sampling window based on shifting values in the shift register.

In Example 5, the subject matter of Example 4 includes, wherein the controller circuit is configured to determine an average stick duration for the second sampling window based on the stick durations associated with the plurality of contact cycles during the second sampling window.

In Example 6, the subject matter of Example 5 includes, wherein the controller circuit is configured to determine a power contact average stick duration increase based on the average stick duration for the first sampling window and the average stick duration for the second sampling window.

In Example 7, the subject matter of Example 6 includes, wherein the controller circuit is configured to generate the EoL prediction based on one or both of the power contact average stick duration increase and a difference between the average stick duration for the second sampling window and an EoL stick duration threshold.

In Example 8, the subject matter of Examples 6-7 includes, wherein the controller circuit is configured to generate the EoL prediction based on at least one of the following: a difference between the average stick duration for the first sampling window and an EoL stick duration threshold; and a difference between the average stick duration for the second sampling window and the EoL stick duration threshold.

In Example 9, the subject matter of Example 8 includes, wherein the EoL stick duration threshold is 1 second or greater.

In Example 10, the subject matter of Examples 6-9 includes, wherein the controller circuit is configured to determine an average stick duration for the third sampling window based on the stick durations associated with the plurality of contact cycles during the third sampling window.

In Example 11, the subject matter of Example 10 includes, wherein the controller circuit is configured to determine a power contact average stick duration speed of increase based on the average stick duration for the first sampling window, the average stick duration for the second sampling window, and the average stick duration for the third sampling window; and generate the EoL prediction for the set of switchable contact electrodes of the power contact based on the power contact average stick duration speed of increase.

In Example 12, the subject matter of Examples 1-11 includes, an arc suppressor adapted to be coupled to the set of switchable contact electrodes, the arc suppressor including the contact separation detector.

In Example 13, the subject matter of Examples 1-12 includes, wherein the contact separation detector comprises a voltage sensor configured to sense voltage across the switchable contact electrodes.

In Example 14, the subject matter of Example 13 includes, wherein the voltage sensor is configured to determine the time of separation of the set of switchable contact electrodes of the power contact during the deactivation when the voltage across the switchable contact electrodes is higher than a plasma ignition voltage level.

Example 15 is a system, comprising: a first pair of terminals adapted to be connected to a first set of switchable contact electrodes of a first power contact; a second pair of terminals adapted to be connected to a second set of switchable contact electrodes of a second power contact; a power switching circuit operatively coupled to the first and second pairs of terminals, the power switching circuit configured to switch power from an external power source and to trigger activation and deactivation of the first set and the second set of switchable contact electrodes based on a logic state signal; an arc suppressor adapted to be coupled to the second set of switchable contact electrodes, the arc suppressor including a contact separation detector configured to determine a time of separation of the second set of switchable contact electrodes during the deactivation; and a controller circuit operatively coupled to the first and second pairs of terminals, the power switching circuit, and the arc suppressor, the controller circuit configured to: determine a plurality of stick durations associated with the second set of switchable contact electrodes, wherein each stick duration of the plurality of stick durations is determined during a corresponding contact cycle of a plurality of contact cycles of the second power contact, and is based on a time duration between generation of the logic state signal triggering the deactivation and the time of separation of the second set of switchable contact electrodes; and generate an end-of-life (EoL) prediction for the second set of switchable contact electrodes based on the determined plurality of stick durations.

In Example 16, the subject matter of Example 15 includes, wherein the plurality of contact cycles take place within at least a first sampling window and a second sampling window, and wherein the controller circuit is configured to store a first subset of the plurality of stick durations determined during the first sampling window in a shift register.

In Example 17, the subject matter of Example 16 includes, wherein the controller circuit is configured to perform an averaging function to determine an average stick duration for the first sampling window based on shifting values in the shift register.

In Example 18, the subject matter of Example 17 includes, wherein the controller circuit is configured to determine an average stick duration for the second sampling window based on a second subset of the plurality of stick durations determined during the second sampling window.

In Example 19, the subject matter of Example 18 includes, wherein the controller circuit is configured to determine a power contact average stick duration increase based on the average stick duration for the first sampling window and the average stick duration for the second sampling window.

In Example 20, the subject matter of Example 19 includes, wherein the controller circuit is configured to generate the EoL prediction based on at least one of the power contact average stick duration increase; and a difference between the average stick duration for the second sampling window and an EoL stick duration threshold.

Example 21 is a method, comprising: coupling a power switching circuit to a pair of terminals of a power contact, the power switching circuit configured to switch power from an external power source and to trigger activation and deactivation of a set of switchable contact electrodes of the power contact based on a logic state signal; coupling a contact separation detector to the pair of terminals, the contact separation detector configured to determine a time of separation of the set of switchable contact electrodes during the deactivation; coupling a controller circuit to the pair of terminals and the contact separation detector, the controller circuit configured to determine a plurality of stick durations associated with the set of switchable contact electrodes, wherein each stick duration of the plurality of stick durations is determined during a corresponding contact cycle of a plurality of contact cycles of the power contact, and is based on a time duration between generation of the logic state signal triggering the deactivation and the time of separation of the second set of switchable contact electrodes, and providing an end-of-life (EoL) prediction for the set of switchable contact electrodes based on the determined plurality of stick durations.

Example 22 is at least one machine-readable medium including instructions that, when executed by processing circuitry, cause the processing circuitry to perform operations to implement of any of Examples 1-21.

Example 23 is an apparatus comprising means to implement of any of Examples 1-21.

Example 24 is a system to implement of any of Examples 1-21.

Example 25 is a method to implement of any of Examples 1-21.

The above detailed description includes references to the accompanying drawings, which form a part of the detailed description. The drawings show, by way of illustration, specific embodiments. These embodiments are also referred to herein as "examples." Such examples may include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the scope disclosed herein.

The above description is intended to be, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, the inventive subject matter may lie in less than all features of a particular disclosed embodiment. Thus, the following claims are hereby incorporated into the Detailed Description, with each claim standing on its own as a separate embodiment.

What is claimed is:

1. An electrical circuit, comprising:
a pair of terminals adapted to be connected to a set of switchable contact electrodes of a power contact;
a power switching circuit operatively coupled to the pair of terminals, the power switching circuit configured to switch power supplied by an external power source and to trigger activation of the set of switchable contact electrodes based on a first logic state signal or deactivation of the set of switchable contact electrodes based on a second logic state signal;
a contact separation detector operatively coupled to the pair of terminals, the contact separation detector configured to determine a time of separation of the set of switchable contact electrodes of the power contact during the deactivation; and
a controller circuit operatively coupled to the pair of terminals, the power switching circuit, and the contact separation detector, the controller circuit configured to:
for each contact cycle of a plurality of contact cycles of the power contact within at least one sampling window:
generate the second logic state signal to trigger the deactivation of the set of switchable contact electrodes; and
determine a stick duration associated with the set of switchable contact electrodes, the stick duration based on a difference between a time the second logic state signal is generated and the time of separation during the contact cycle; and
generate end-of-life (EoL) prediction for the set of switchable contact electrodes of the power contact based on the determined stick duration for each contact cycle of the plurality of contact cycles within the at least one sampling window.

2. The electrical circuit of claim 1, wherein the at least one sampling window comprises at least a first sampling window, a second sampling window, and a third sampling window, and wherein the plurality of contact cycles within each of the sampling windows is N contact cycles, N being a power of 2 integer.

3. The electrical circuit of claim 2, wherein the controller circuit is configured to:
store the determined stick durations associated with the plurality of contact cycles during the first sampling window in a shift register.

4. The electrical circuit of claim 3, wherein the controller circuit is configured to:
perform an averaging function to determine an average stick duration for the first sampling window based on shifting values in the shift register, wherein to divide by N, the values in the shift register are shifted to the right by N bits.

5. The electrical circuit of claim 4, wherein the controller circuit is configured to:
determine an average stick duration for the second sampling window based on the stick durations associated with the plurality of contact cycles during the second sampling window.

6. The electrical circuit of claim 5, wherein the controller circuit is configured to:
determine a power contact average stick duration increase based on the average stick duration for the first sampling window and the average stick duration for the second sampling window.

7. The electrical circuit of claim 6, wherein the controller circuit is configured to:
generate the EoL prediction based on one or both of the power contact average stick duration increase and a difference between the average stick duration for the second sampling window and an EoL stick duration threshold.

8. The electrical circuit of claim 6, wherein the controller circuit is configured to:
generate the EoL prediction based on at least one of the following:
a difference between the average stick duration for the first sampling window and an EoL stick duration threshold; and
a difference between the average stick duration for the second sampling window and the EoL stick duration threshold.

9. The electrical circuit of claim 8, wherein the EoL stick duration threshold is 1 second or greater.

10. The electrical circuit of claim 6, wherein the controller circuit is configured to:
determine an average stick duration for the third sampling window based on the stick durations associated with the plurality of contact cycles during the third sampling window.

11. The electrical circuit of claim 10, wherein the controller circuit is configured to:
determine a power contact average stick duration speed of increase based on the average stick duration for the first sampling window, the average stick duration for the second sampling window, and the average stick duration for the third sampling window; and
generate the EoL prediction for the set of switchable contact electrodes of the power contact based on the power contact average stick duration speed of increase.

12. The electrical circuit of claim 1, further comprising:
an arc suppressor adapted to be coupled to the set of switchable contact electrodes, the arc suppressor including the contact separation detector.

13. The electrical circuit of claim 1, wherein the contact separation detector comprises a voltage sensor configured to sense voltage across the switchable contact electrodes.

14. The electrical circuit of claim 13, wherein the voltage sensor is configured to:
determine the time of separation of the set of switchable contact electrodes of the power contact during the deactivation when the voltage across the switchable contact electrodes is higher than a plasma ignition voltage level.

15. A system, comprising:
a first pair of terminals adapted to be connected to a first set of switchable contact electrodes of a first power contact;
a second pair of terminals adapted to be connected to a second set of switchable contact electrodes of a second power contact;
a power switching circuit operatively coupled to the first and second pairs of terminals, the power switching circuit configured to switch power from an external power source and to trigger activation and deactivation of the first set and the second set of switchable contact electrodes based on a logic state signal;
an arc suppressor adapted to be coupled to the second set of switchable contact electrodes, the arc suppressor including a contact separation detector configured to determine a time of separation of the second set of switchable contact electrodes during the deactivation; and
a controller circuit operatively coupled to the first and second pairs of terminals, the power switching circuit, and the arc suppressor, the controller circuit configured to:
determine a plurality of stick durations associated with the second set of switchable contact electrodes,
wherein each stick duration of the plurality of stick durations is determined during a corresponding contact cycle of a plurality of contact cycles of the second power contact, and is based on a time duration between generation of the logic state signal triggering the deactivation and the time of separation of the second set of switchable contact electrodes; and
generate end-of-life (EoL) prediction for the second set of switchable contact electrodes based on the determined plurality of stick durations.

16. The system of claim 15, wherein the plurality of contact cycles take place within at least a first sampling window and a second sampling window, and wherein the controller circuit is configured to:
store a first subset of the plurality of stick durations determined during the first sampling window in a shift register.

17. The system of claim 16, wherein the controller circuit is configured to:
perform an averaging function to determine an average stick duration for the first sampling window based on shifting values in the shift register.

18. The system of claim 17, wherein the controller circuit is configured to:
determine an average stick duration for the second sampling window based on a second subset of the plurality of stick durations determined during the second sampling window.

19. The system of claim 18, wherein the controller circuit is configured to:
determine a power contact average stick duration increase based on the average stick duration for the first sampling window and the average stick duration for the second sampling window.

20. The system of claim 19, wherein the controller circuit is configured to:
generate the EoL prediction based on at least one of:
the power contact average stick duration increase; and
a difference between the average stick duration for the second sampling window and an EoL stick duration threshold.

* * * * *

UNITED STATES PATENT AND TRADEMARK OFFICE
CERTIFICATE OF CORRECTION

PATENT NO. : 10,727,010 B1
APPLICATION NO. : 16/776123
DATED : July 28, 2020
INVENTOR(S) : Henke et al.

Page 1 of 1

It is certified that error appears in the above-identified patent and that said Letters Patent is hereby corrected as shown below:

On the Title Page

In item (65), in "Prior Publication Data", in Column 1, Line 1, after "2020", insert
--¶(65) Prior Publication Data
US 2020/0243275 A1 Jul. 30, 2020--

Signed and Sealed this
Fifth Day of January, 2021

Andrei Iancu
*Director of the United States Patent and Trademark Office*